US011149350B2

(12) United States Patent
Adachi et al.

(10) Patent No.: US 11,149,350 B2
(45) Date of Patent: Oct. 19, 2021

(54) SHOWER PLATE STRUCTURE FOR SUPPLYING CARRIER AND DRY GAS

(71) Applicant: ASM IP HOLDING B.V., Almere (NL)

(72) Inventors: Wataru Adachi, Kawasaki (JP); Kazuo Sato, Kawasaki (JP)

(73) Assignee: ASM IP HOLDING B.V., Almere (NL)

( * ) Notice: Subject to any disclaimer, the term of this patent is extended or adjusted under 35 U.S.C. 154(b) by 175 days.

(21) Appl. No.: 15/867,669

(22) Filed: Jan. 10, 2018

(65) Prior Publication Data
US 2019/0211450 A1 Jul. 11, 2019

(51) Int. Cl.
C23C 16/455 (2006.01)
C23C 16/50 (2006.01)
C23C 16/458 (2006.01)
H01L 21/02 (2006.01)

(52) U.S. Cl.
CPC ...... *C23C 16/45565* (2013.01); *C23C 16/458* (2013.01); *C23C 16/45527* (2013.01); *C23C 16/45542* (2013.01); *C23C 16/45568* (2013.01); *C23C 16/45574* (2013.01); *C23C 16/50* (2013.01); *H01L 21/0228* (2013.01); *H01L 21/02164* (2013.01); *H01L 21/02274* (2013.01)

(58) Field of Classification Search
CPC ........ C23C 16/45565; C23C 16/45542; C23C 16/45527; C23C 16/458; C23C 16/50; C23C 16/45574; C23C 16/45568; H01L 21/02274; H01L 21/02164; H01L 21/0228
See application file for complete search history.

(56) References Cited

U.S. PATENT DOCUMENTS

| 4,209,357 | A | | 6/1980 | Gorin et al. |
| 4,263,088 | A | * | 4/1981 | Gorin ............... H01J 37/32935 |
| | | | | 204/192.32 |
| 4,590,042 | A | * | 5/1986 | Drage ................. H01J 37/3244 |
| | | | | 156/345.34 |
| 5,746,875 | A | * | 5/1998 | Maydan ............ C23C 16/45574 |
| | | | | 118/723 E |

(Continued)

FOREIGN PATENT DOCUMENTS

JP 5444599 3/2014
WO WO-2011062286 A1 * 5/2011 ............. C23C 16/24

*Primary Examiner* — Jeffrie R Lund
(74) *Attorney, Agent, or Firm* — Pillsbury Winthrop Shaw Pittman, LLP

(57) ABSTRACT

A shower plate for a plasma deposition apparatus, the shower plate including: a plurality of apertures each extending from a rear surface of the shower plate to a front surface for passing a carrier gas therethrough in this direction to a chamber, a plurality of first apertures each extending from a first connecting aperture to an inner part of the front surface for passing gas therethrough in this direction to the chamber, and a plurality of second apertures each extending from a second connecting aperture to an outer part of the front surface for passing gas therethrough in this direction to the chamber, wherein the first connecting aperture connects the first apertures to at least one first aperture extending from a sidewall side of the shower plate and the second connecting aperture connects the second apertures to at least one second aperture extending from the sidewall side.

19 Claims, 19 Drawing Sheets

(56) References Cited

U.S. PATENT DOCUMENTS

| | | | | |
|---|---|---|---|---|
| 6,508,197 | B1* | 1/2003 | Omstead | C23C 16/4408 118/715 |
| 6,537,418 | B1* | 3/2003 | Muller | H01J 37/32834 156/345.34 |
| 8,211,232 | B2* | 7/2012 | Hayashi | C23C 16/4401 118/715 |
| 8,282,769 | B2* | 10/2012 | Iizuka | H01J 37/3244 118/715 |
| 8,366,828 | B2* | 2/2013 | Iizuka | C23C 16/4412 118/715 |
| 8,758,550 | B2* | 6/2014 | Iizuka | H01J 37/32541 118/715 |
| 8,852,387 | B2* | 10/2014 | Iizuka | C23F 1/08 118/715 |
| 8,869,742 | B2* | 10/2014 | Dhindsa | C23C 16/4412 118/723 E |
| 9,017,481 | B1* | 4/2015 | Pettinger | H01J 37/3244 118/724 |
| 9,064,815 | B2* | 6/2015 | Zhang | H01J 37/32422 |
| 9,324,576 | B2* | 4/2016 | Zhang | H01L 21/31116 |
| 9,349,605 | B1* | 5/2016 | Xu | H01L 21/31116 |
| 10,418,246 | B2* | 9/2019 | Kuratomi | C23C 16/45574 |
| 10,478,837 | B2* | 11/2019 | Cacka | E03C 1/0409 |
| 2002/0007790 | A1* | 1/2002 | Park | C23C 16/4405 118/715 |
| 2005/0205015 | A1* | 9/2005 | Sasaki | C23C 16/45565 118/723 MA |
| 2007/0251642 | A1* | 11/2007 | Bera | H01J 37/32082 156/345.26 |
| 2010/0117204 | A1* | 5/2010 | Matsuoka | C23C 16/0272 257/635 |
| 2016/0153088 | A1* | 6/2016 | Tsuji | C23C 16/4412 118/728 |
| 2016/0362783 | A1* | 12/2016 | Tolle | C23C 16/4405 |
| 2018/0096821 | A1* | 4/2018 | Lubomirsky | H01J 37/3244 |
| 2018/0374682 | A1* | 12/2018 | Tanikawa | H01J 37/32495 |
| 2019/0119816 | A1* | 4/2019 | Zhang | C23C 16/45572 |
| 2019/0211450 | A1* | 7/2019 | Adachi | C23C 16/45527 |
| 2020/0032393 | A1* | 1/2020 | Jung | C23C 16/45563 |

\* cited by examiner

Condition 2

Condition 3

Condition 2

Condition 3

FIG.21

|  | Carrier gas flow[slm] | Dry gas flow (inner)[slm] | Dry gas flow (outer)[slm] | Relative residence time to condition 1 (at each position) | |
|---|---|---|---|---|---|
|  |  |  |  | At center | At edge |
| Condition 1 | 2.00 | 1.00 | 1.00 | 1.00 | 1.00 |
| Condition 2 | 2.00 | 0.47 | 1.53 | 1.36 | 1.00 |
| Condition 3 | 2.00 | 1.35 | 0.65 | 0.85 | 1.00 |

FIG.22

|  | Carrier gas flow[slm] | Dry gas flow (inner)[slm] | Dry gas flow (outer)[slm] | Relative residence time to condition 1 (at each position) | |
|---|---|---|---|---|---|
|  |  |  |  | At center | At edge |
| Condition 1 | 2.00 | 1.00 | 1.00 | 1.00 | 1.00 |
| Condition 2 | 2.00 | 0.92 | 1.08 | 1.04 | 1.00 |
| Condition 3 | 2.00 | 1.07 | 0.93 | 0.97 | 1.00 |

SHOWER PLATE STRUCTURE FOR SUPPLYING CARRIER AND DRY GAS

FIELD

The present description relates generally to a deposition apparatus including a plasma deposition apparatus used in a semiconductor manufacturing process, in particular to a shower plate structure provided in such an apparatus.

BACKGROUND

Plasma enhanced CVD (PECVD) and plasma enhanced ALD (PEALD) processes are generally used to deposit a film on a patterned surface of a workpiece, such as a semiconductor substrate. Those processes are typically accomplished by introducing a precursor gas into a chamber that contains a workpiece. The precursor gas is usually directed downwardly with the aid of a carrier gas via a plurality of apertures of a shower plate located at the top of the chamber. A dry gas (e.g., a reactant gas or a purge gas) is also directed downwardly via the same plurality of apertures of the shower plate located at the top of the chamber.

SUMMARY

Process gases are typically provided by a showerhead. FIG. 1 shows an overview of a conventional showerhead 1 having a gas channel 3 to supply gas to a shower plate structure 2, where the gas channel 3 is connected to the shower plate structure 2 via a fastener 5 and sealed by a seal 4 (e.g., an O-ring). The precursor gas supplied in the gas channel is introduced into the chamber with the aid of the carrier gas via a number of holes of the shower plate structure. The dry gas supplied in the gas inlet space is also introduced via the number of holes of the same shower plate structure into the chamber.

To improve the quality of the film including, but not limited to, uniformity of the film, it is desirable to be able to optimally control the amount of the gas to be provided depending on the area of the chamber. However, conventionally, it has been practicably difficult to change the flow rate of the gas from the plurality of holes of the shower plate on an area-by-area basis (e.g., the inner part and outer part of the shower plate) such that the residence time of a precursor gas or a reactant gas around the surface of the workpiece can be controlled, as the gas typically passes through the plurality of apertures of the shower plate uniformly.

In an aspect, there is provided a shower plate adapted to be installed in a plasma deposition apparatus comprising a gas inlet port, a showerhead, a workpiece support and a reaction chamber, the shower plate adapted to be attached to the showerhead and comprising: a front surface adapted to face the workpiece support; a rear surface opposite to the front surface; and a sidewall that defines the width of the shower plate, wherein the shower plate has a plurality of apertures each extending from the rear surface to the front surface for passing a carrier gas therethrough in this direction, and wherein the shower plate further has a plurality of first apertures each extending from first connecting apertures to an inner part of the front surface therethrough in this direction for passing a dry gas to the chamber, and a plurality of second apertures each extending from a second connecting apertures to an outer part of the front surface therethrough in this direction for passing a dry gas to the chamber, and wherein the first connecting apertures connect the plurality of first apertures to at least one first aperture extending from the sidewall side of the shower plate and the second connecting apertures connect the plurality of second apertures to at least one second aperture extending from the sidewall side of the shower plate.

In some embodiments, the inner part of the front surface of the shower plate has an area of a circle-like shape with a diameter of about 50-300 mm, and the outer part of the front surface of the shower plate is the rest of the area of the front surface until about 50-350 mm from the center of the front surface.

In some embodiments, the shower plate further has at least one stepped section on the rear surface side of the shower plate, the rear surface being surrounded peripherally by the at least one stepped section and the at least one first aperture and the at least one second aperture extending from the sidewall side of the shower plate extend from a surface of the at least one stepped section of the shower plate.

For purposes of summarizing aspects of the invention and one or more advantages achieved over the related art, certain non-limiting objects and advantages are described in this disclosure. Of course, it is to be understood that not necessarily all or any such objects or advantages may be achieved in accordance with any particular embodiment. Thus, for example, those skilled in the art will recognize that the invention may be embodied or carried out in a manner that achieves or optimizes one advantage or group of advantages as taught herein without necessarily achieving one or more other objects or advantages as may be taught or suggested herein. Further aspects, features and advantages of this invention will become apparent from the detailed description which follows.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

BRIEF DESCRIPTION OF THE DRAWINGS

Features of the invention will now be described with reference to the drawings of embodiments that are intended to illustrate and not to limit the invention. The drawings are oversimplified for illustrative purposes and are not necessarily to scale.

FIG. 21 is a table showing carrier gas flow, dry gas (inner) flow, dry gas (outer) flow and relative residence time according to Example 1.

FIG. 22 is a table showing carrier gas flow, dry gas (inner) flow, dry gas (outer) flow and relative residence time according to Example 2.

DETAILED DESCRIPTION

Figure 1:
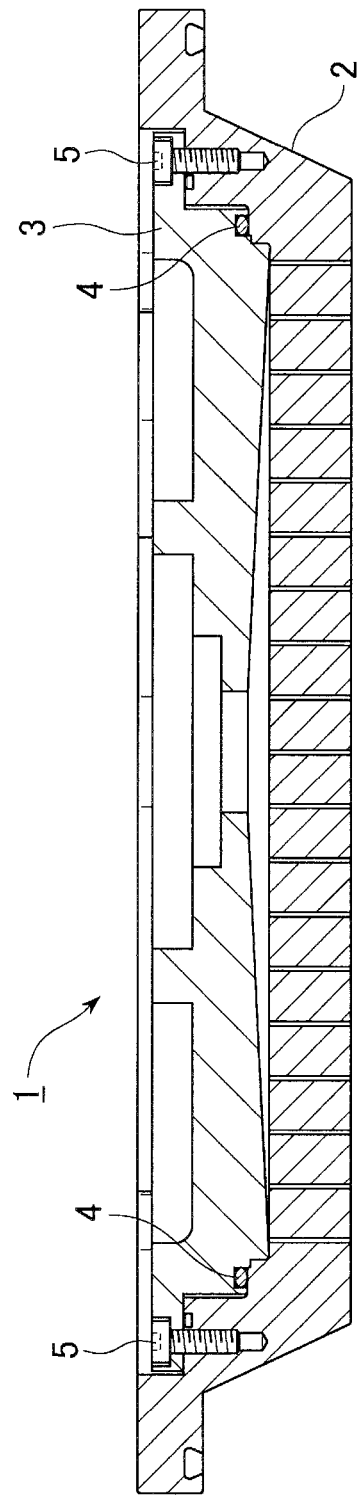
FIG. 1 is a schematic view of a conventional showerhead having a shower plate structure and a gas channel.

The present invention includes, but is not limited to, the following embodiments:

As an example of a process, plasma enhanced ALD (PEALD) processes are explained to better understand when and how the shower plate is used to deposit films. Needless to say, the shower plate can alternatively or additionally be used in a PECVD process. However, embodiments of the present invention are not limited to use only in PEALD and PECVD processes.

As explained above, the shower plate can be used in PECVD and PEALD processes. In PEALD processes, a workpiece (e.g., a substrate such as a semiconductor wafer) is placed in a reaction chamber and subjected to alternately repeated surface reactions. As an example, thin SiO films are formed by repetition of a self-limiting ALD cycle. Desirably, for forming SiO films, each ALD cycle comprises at least two distinct phases. The provision and removal of a reactant from the reaction space may be considered a phase. In a first phase, a first reactant comprising silicon is provided and forms no more than about one monolayer on the workpiece surface. This reactant is also referred to herein as a "silicon precursor," "silicon-containing precursor," "halogen-containing silicon precursor" or "silicon reactant", and may be selected from the group consisting of BDEAS (bisdiethyl-aminosilane), BEMAS (bisethylmethylaminosilane), 3DMAS (trisdimethylaminosilane), and HEAD (hexakisethylaminosilane). A silicon-containing precursor may include $HSiI_3$, $H_2SiI_2$, $H_3SiI$, $H_2Si_2I_4$, $H_4SiI_2I_2$, $H_5Si_2I$ and so forth. The precursor may also be a metal-containing precursor, such as TDMAT (tetrakis(dimethylamino)titanium), TDEAT (tetrakis(diethylamino)titanium) and Tris(dimethylamino) cyclopentadienyl Zirconium. In a second phase, a second reactant comprising a reactive species is provided and may convert adsorbed silicon to silicon oxide. The second reactant may comprise a oxygen precursor. The reactive species may comprise an excited species. A reactive species from, e.g., a noble gas does not necessarily contribute material to the deposited film, but can in some circumstances contribute to film growth as well as help in the formation and ignition of plasma. In some embodiments a gas that is used to form a plasma may flow constantly throughout the deposition process but only be activated intermittently.

Additional phases may be added and phases may be removed as desired to adjust the composition of the final film. One or more of the reactants may be provided with the aid of a carrier gas, such as Ar or He or $N_2$. The precursor and the second reactant are provided with the aid of a carrier gas. Two of the phases may overlap, or be combined. For example, the precursor and the second reactant may be provided simultaneously in pulses that partially or completely overlap. In addition, although referred to as first and second phases, and first and second reactants, the order of the phases may be varied, and an ALD cycle may begin with any one of the phases. That is, unless specified otherwise, the reactants can be provided in any order, and the process may begin with any of the reactants.

Figure 2:
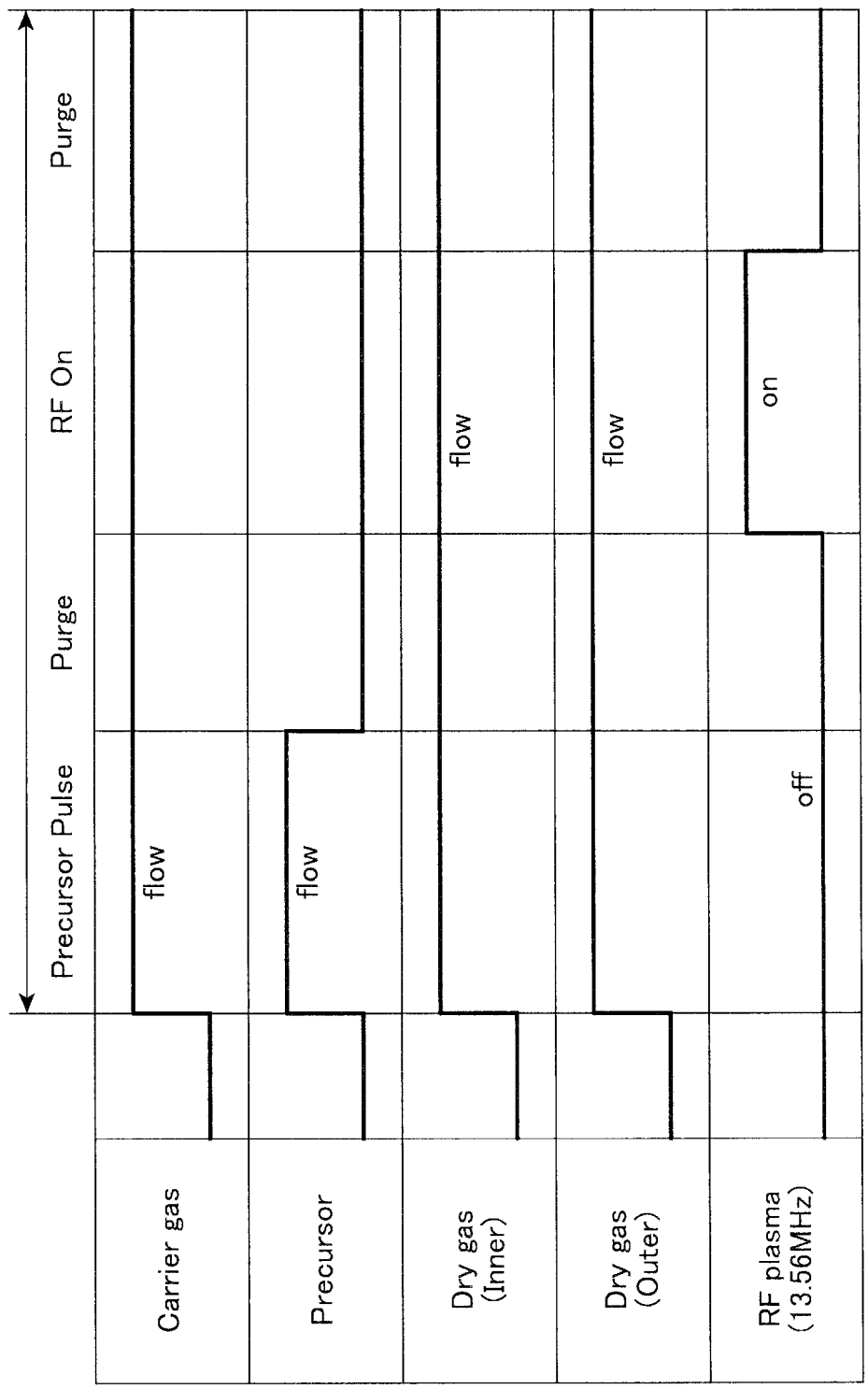
FIG. 2 is a timing chart for one cycle for depositing a film by PEALD according to an embodiment.

One example of a timing chart of one PEALD cycle is shown in FIG. 2. In this example, silicon precursor is supplied with a single pulse with the aid of a carrier gas that is continuously introduced to the reactor at a constant rate, while dry gas (e.g., oxygen reactant gas) is introduced to the reactor continuously at a constant rate. As shown in FIG. 2, the dry gas (inner) and the dry gas (outer) can be separately and independently controlled, which will be explained more in detail in conjunction with FIGS. 4-13. When the silicon precursor pulse stops, RF power is applied with a single pulse after the silicon precursor is purged during the purge cycle. The silicon precursor pulse and RF power pulse do not overlap with each other. The reactor is always evacuated and a constant pressure is basically maintained. Even when the silicon precursor pulse stops, a carrier gas and a dry gas (e.g., oxygen reactant gas) will continuously flow in and therefore virtually all silicon precursor can be purged from the substrate surface. The carrier gas may be selected from the group consisting of $N_2$, Ar, He, Xe, rare gas and so forth. The dry gas may be selected from the group consisting of $N_2$, Ar, He, Xe, rare gas, $O_2$, $NH_3$, $H_2$, $CO_2$, $N_2O$ and so forth.

Next, the configuration of the plasma deposition apparatus is explained in detail below.

Figure 3:
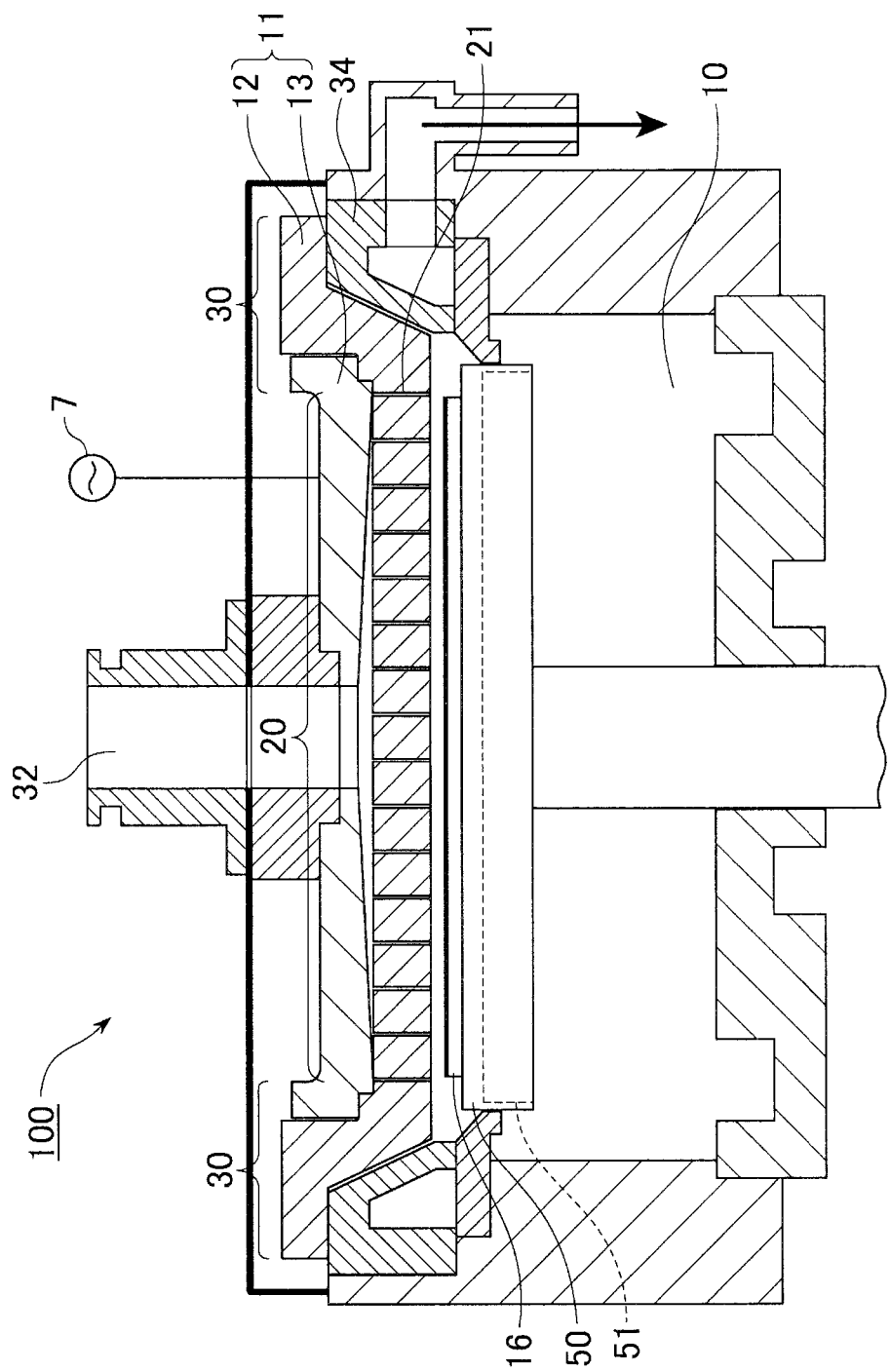
FIG. 3 is a schematic view of a PEALD apparatus showing a basic structure according to an embodiment.

As an example of the plasma deposition apparatus, FIG. 3 shows a schematic view of an embodiment of a PEALD apparatus. As noted above, the shower plate can be used additionally or alternatively in a PECVD process, or used in an entirely different process other than a PEALD or PECVD process. As shown in FIG. 3, the PEALD apparatus 100 comprises a vacuum (reaction) chamber 10, and a showerhead 11 provided at the top of the vacuum chamber 10 and insulated from the vacuum chamber 10. A susceptor 50 is provided inside the vacuum chamber 10 substantially parallel to the showerhead 11. RF power source 7 is connected to a gas duct attached to the showerhead 11. The vacuum chamber 10 has an opening with an exhaust valve (not shown) at its side portion and comprises an exhaust duct (not shown) connected to an exhaust pump (not shown). Additionally, the vacuum chamber 10 is grounded. The vacuum chamber 10 also has an opening with a gate valve (not shown) on an inner side wall for workpiece transfer.

The showerhead 11 has a hollow structure, and an upper tubular portion comprises a gas inlet port 32 (gas inlet space) connected to a gas line (not shown). Additionally, at the bottom face of the showerhead 11, a shower plate structure 12 (shower plate) is removably attached. In the shower plate structure 12, many gas outlet apertures 21 (holes or pores) are formed so that a jet of a carrier gas (and a precursor gas) introduced from the gas inlet port 32, which is at least partially defined by the shower plate structure 12 and a gas channel 13, is emitted from the apertures 21 toward the susceptor 50. Although not shown in FIG. 3, there are at least one aperture 22 (desirably a plurality of apertures or holes) and at least one aperture 23 (desirably a plurality of apertures or holes) are also formed in the shower plate for passing dry gas therethrough to within the chamber. The susceptor 50 may include a heater 51 at the lower end of the susceptor 50. The surface of the susceptor 50 is disposed substantially parallel to the shower plate structure 12 and holds a workpiece (e.g., a substrate) 16 placed on its upper surface.

As shown in FIG. 3, the shower plate 12 also has at least one stepped section 30 on the rear surface side of the shower plate structure 12, and a rear surface area 20 (a front surface) is surrounded peripherally (e.g., circumferentially) by the at least one stepped section 30. The stepped section 30 is supported on a structure 34.

Figure 4:
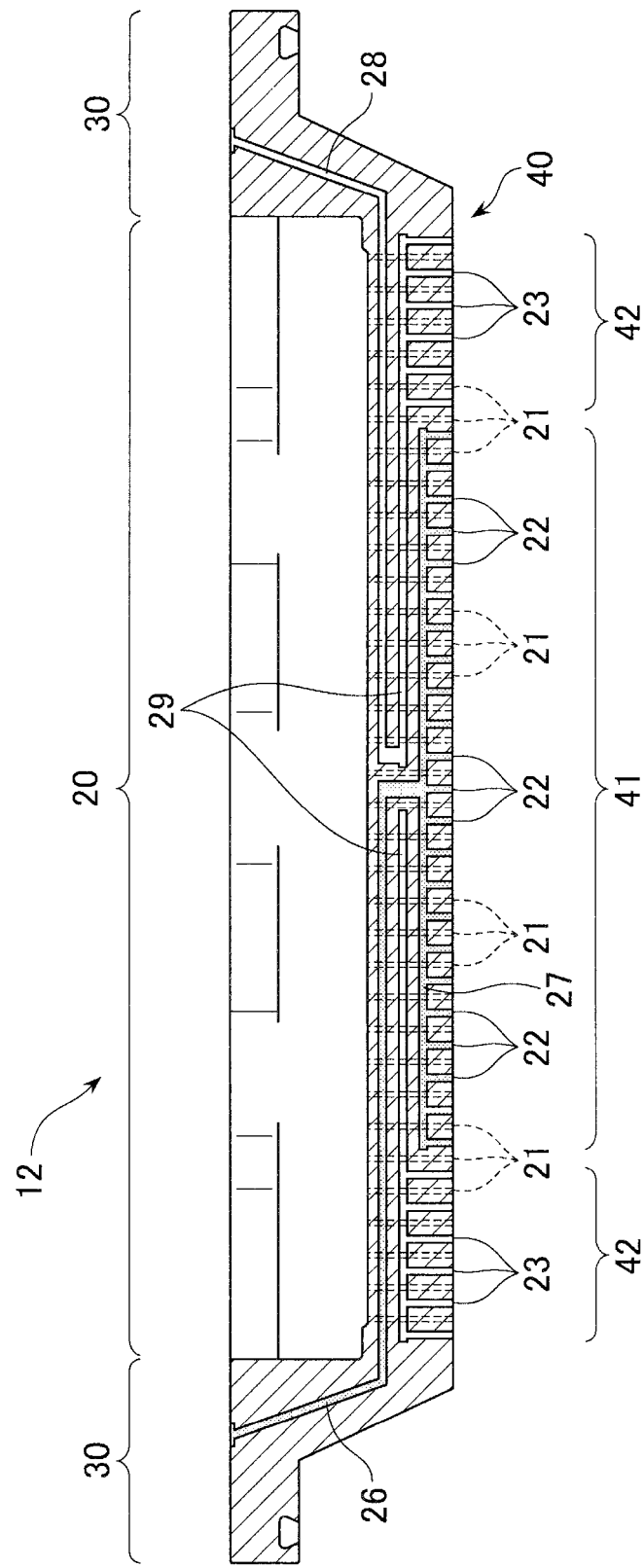
FIG. 4 is a cross-sectional view at the location shown in FIG. 6 of the shower plate according to an embodiment.

Although not shown in FIG. 3, FIG. 4 shows that at least one first aperture 22 (desirably a plurality of first apertures or holes, e.g., 437 apertures, are formed) is formed, in addition to the at least one aperture 21, such that it extends from at least one first connecting aperture 27 (desirably a plurality of first connecting apertures) to an inner area 41 of the front surface (the front surface area 40) of the shower plate 12 for passing a dry gas therethrough in this direction (at least one second aperture 23 is only partially shown). The at least one first connecting aperture 27 is connected to a first aperture 26 (at least one first aperture) such that a dry gas is introduced to the first aperture 26, the at least one first connecting aperture 27, and then to the at least one first aperture 22.

In FIG. 4, the first aperture 26 extends from the surface of the at least one stepped section 30 of the rear surface side of the shower plate 12. The first aperture 26 may extend from the surface of the sidewall of the shower plate 12. The inner area 41 may form a circle-like two-dimensional shape with a diameter of about 50-300 mm. However, the inner area 41 may have a different two-dimensional shape and/or size. The dry gas (inner) as shown in FIG. 2 is introduced to the chamber through the at least one first aperture 22.

Figure 5:
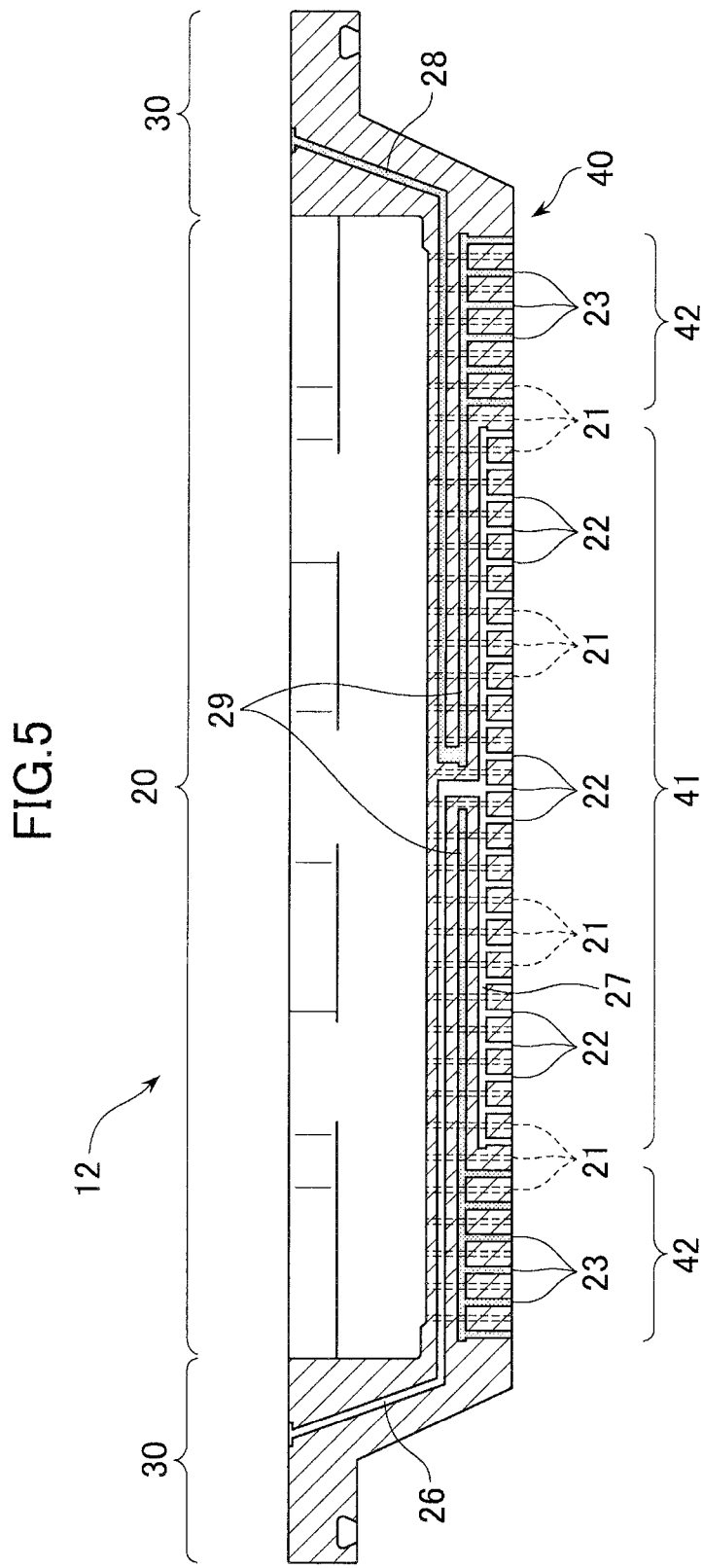
FIG. 5 is a cross-sectional view at the location shown in FIG. 6 of the shower plate according to an embodiment.

Next, as FIG. 5 shows, at least one second aperture 23 (desirably a plurality of second apertures or holes, e.g., 504 apertures, are formed) is formed, in addition to the at least one aperture 21, such that it extends from at least one second connecting aperture 29 (desirably a plurality of second connecting apertures) to an outer area 42 of the front surface (the front surface area 40) of the shower plate 12 for passing a dry gas therethrough in this direction (at least one first aperture 22 is only partially shown). The at least one second connecting aperture 29 are connected to a second aperture 28 (at least one second aperture) such that a dry gas is introduced to the second aperture 28, the at one second connecting aperture 29, and then to the at least one second aperture 23.

In FIG. 5, the second aperture 28 extends from the surface of the at least one stepped section 30 of the rear surface side of the shower plate 12. The second aperture 28 may extend from the surface of the sidewall of the shower plate 12. The outer area 42 is the rest of the area of the front surface (the front surface area 40) other than the inner area 41. The dry gas (outer) as shown in FIG. 2 is introduced to the chamber through the at least one second aperture 23.

Figure 6:
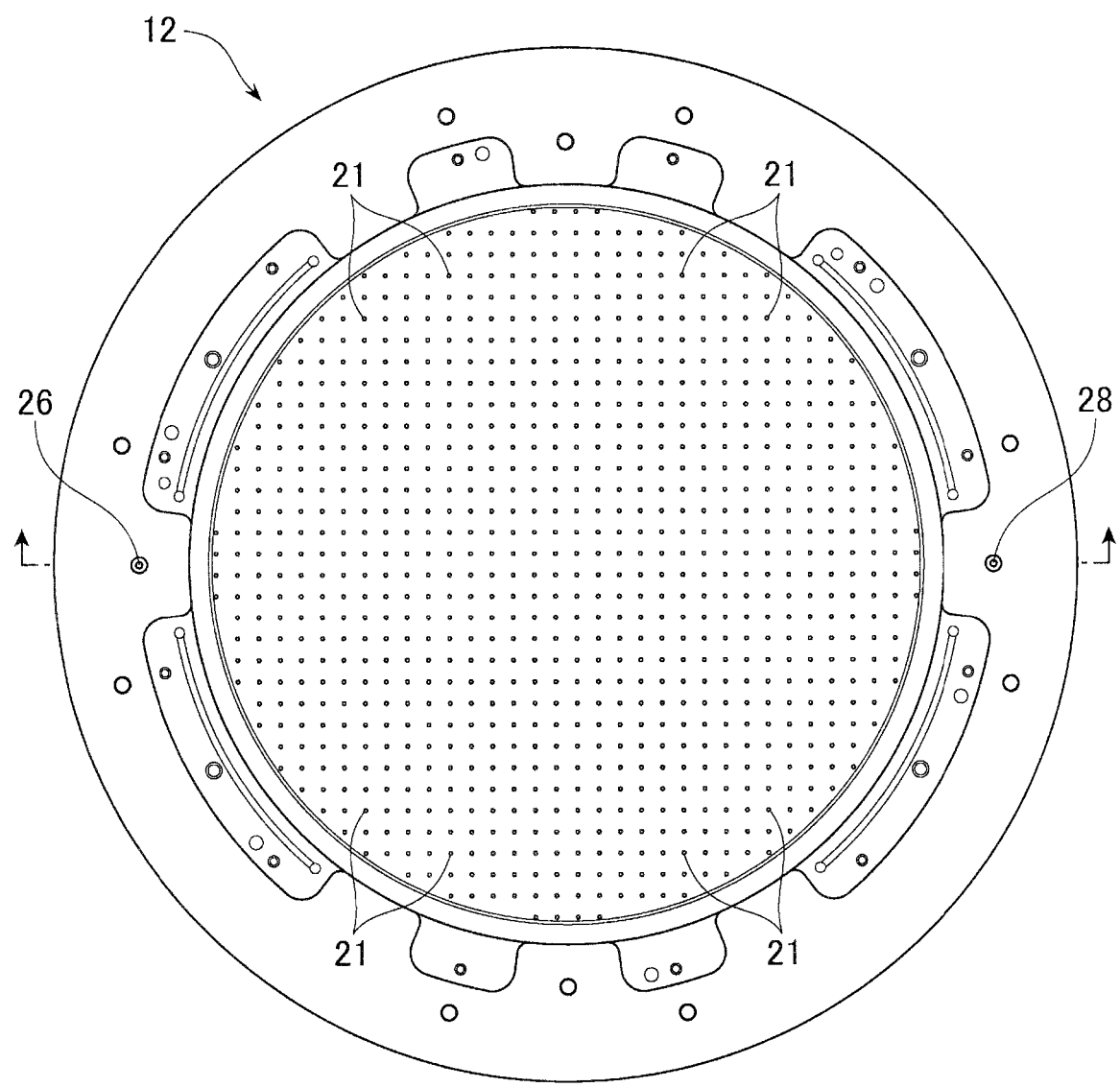
FIG. 6 is a top view of the shower plate according to an embodiment.

FIG. 6 shows a top view of the shower plate 12 (a rear surface side of the shower plate 12). As shown in FIG. 6, there are a plurality of apertures 21 (e.g., 928 apertures are formed) for passing a carrier gas (and a precursor gas) to the chamber 10 on the other side of the shower plate 12. In FIG. 6, one end of the first aperture 26 and one end of the second aperture 28 are also shown at the surface of the at least one stepped section.

Figure 7:
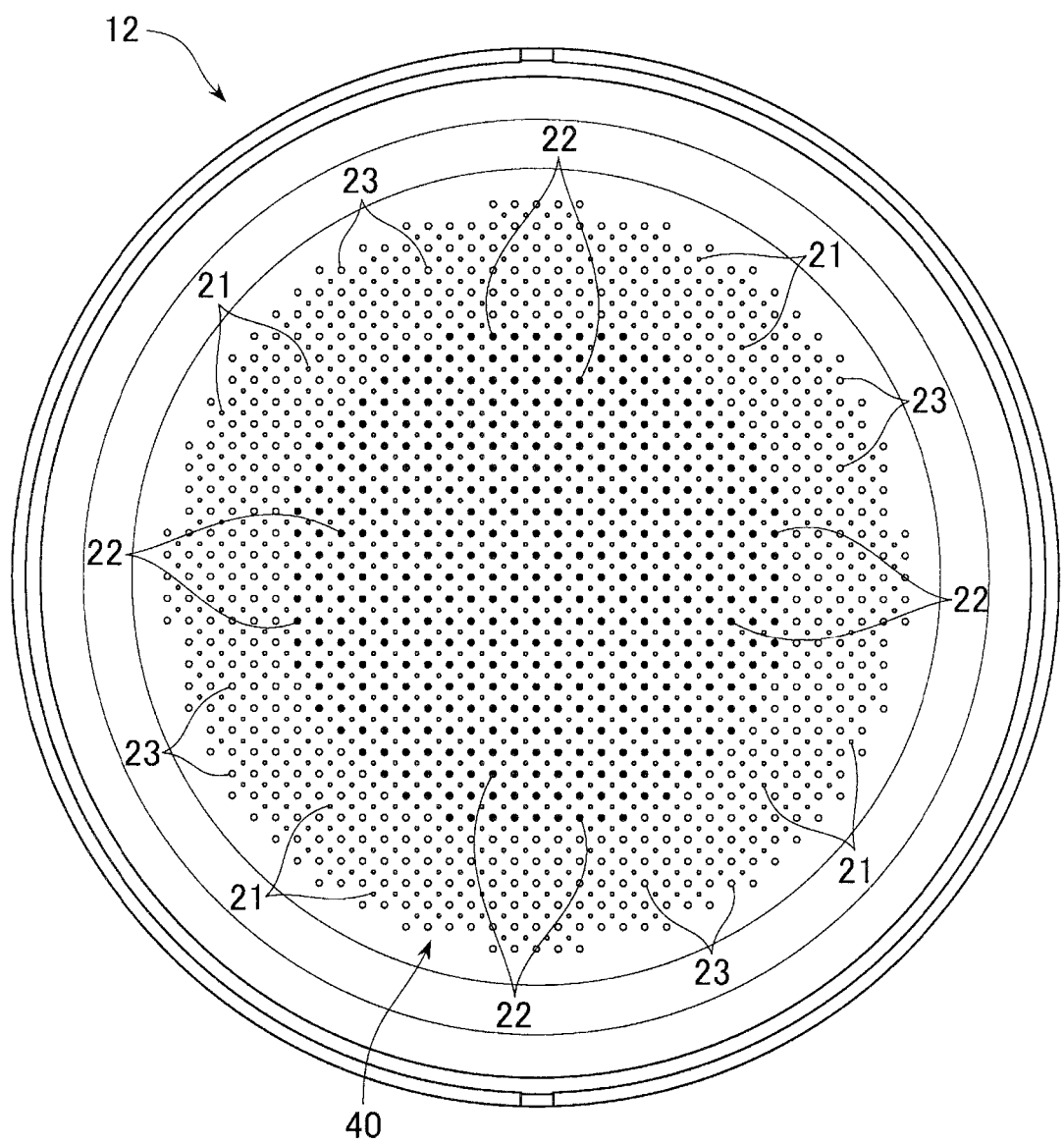
FIG. 7 is a bottom view of the shower plate according to an embodiment.

FIG. 7 shows a bottom view of the shower plate 12 (a front surface side of the shower plate 12). As shown in FIG. 7, there are a plurality of apertures 21 (e.g., 928 apertures are formed) for passing the carrier gas (and the precursor gas) to the chamber 10 on the other side of the shower plate 12. Also, there are a plurality of first apertures 22 (e.g., 437 apertures are formed) for passing the dry gas (inner) to the chamber 10, and a plurality of second apertures 23 (e.g., 504 apertures are formed) for passing the dry gas (outer) to the chamber 10. For illustrative purposes, these apertures 21, 22 and 23 are depicted differently in shape, size and so forth in FIG. 7, however, these apertures 21, 22 and 23 may have the same size and shape. Typically, the cross-sectional width (e.g., diameter) of each of the plurality of apertures 21, each of the plurality of first apertures 22, and each of the plurality of second apertures 22 is about 0.5 mm.

Figure 8:
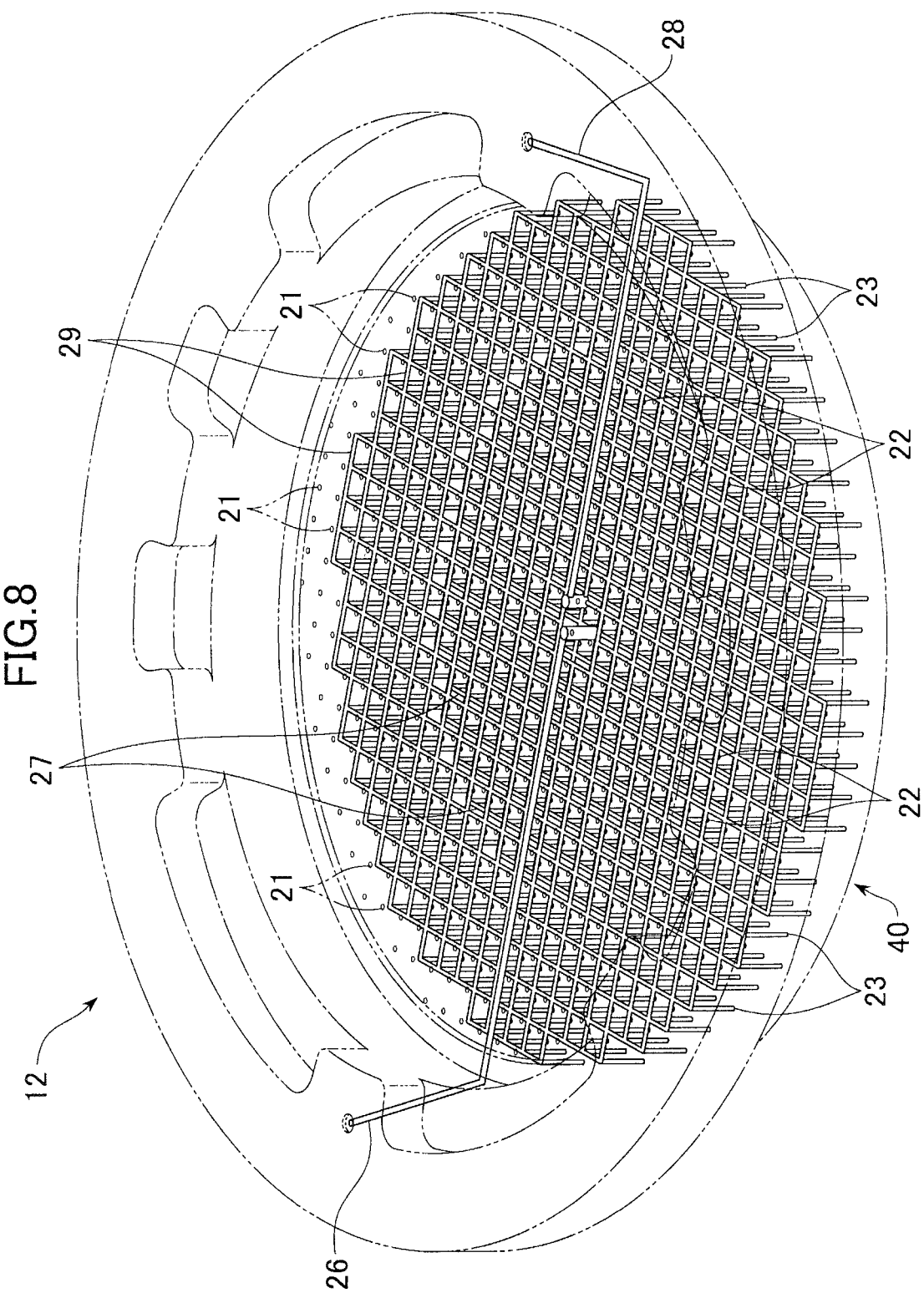
FIG. 8 is a perspective view of the plurality of first apertures and the plurality of second apertures of the shower plate according to an embodiment.

FIG. 8 shows a schematic illustration of a perspective view of the plurality of first apertures 22 and the plurality of second apertures 23 formed in the shower plate 12 (for illustrative purposes, the three-dimensional shape of the apertures 21 are omitted). As shown in FIG. 8, the plurality of first apertures 22 are formed in the inner area of the front surface area 40 and are connected via a plurality of first connecting apertures 27 (e.g., connecting lines or ducts) to at least one first aperture 26 (at least one main line or duct). The at least one first aperture 26 extends from the surface of the stepped section (at least one stepped section 30) to the inner side of the shower plate 12, and it further extends in parallel to the shower plate 12 to the center area of the shower plate 12, and then connects to the first connecting apertures 27. The first connecting apertures 27 are composed of a plurality of connecting apertures that connect the at least one first aperture 26 to each of the plurality of first apertures 22.

As shown in FIG. 8, the plurality of second apertures 23 are formed in the outer area of the front surface area 40 and are connected via a plurality of second connecting apertures 29 (e.g., connecting lines or ducts) to at least one second aperture 28 (at least one main line or duct). The at least one second aperture 28 extends from the surface of the stepped section (at least one stepped section 30) to the inner side of the shower plate 12, and it further extends in parallel to the shower plate 12 to the center area of the shower plate 12, and then connects to the second connecting apertures 29. The second connecting apertures 29 are composed of a plurality of connecting apertures that connect the at least one second aperture 28 to each of the plurality of second apertures 23.

Figure 9:
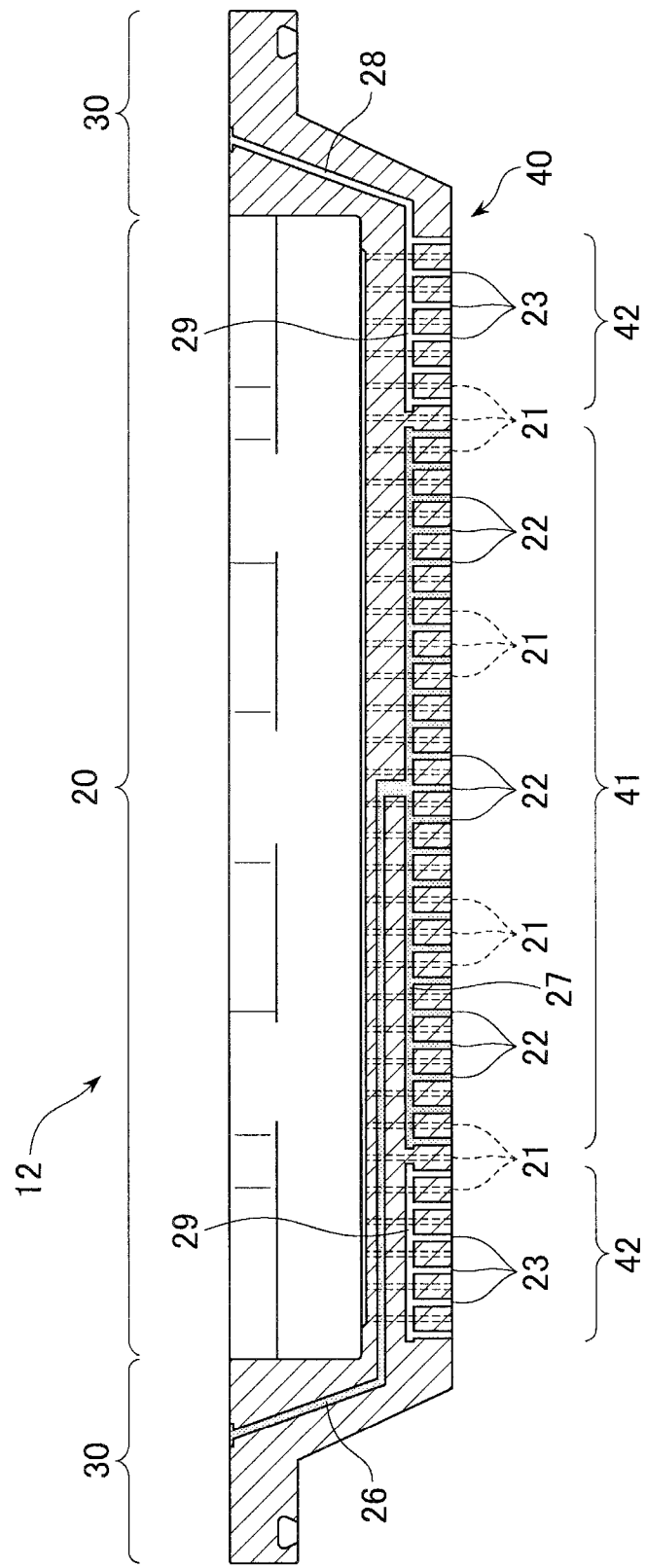
FIG. 9 is a cross-sectional view at the location shown in FIG. 11 of the shower plate according to an embodiment.

FIGS. 9-13 show a further embodiment of the shower plate structure 12. FIG. 9 shows that at least one first aperture 22 (desirably a plurality of first apertures or holes, e.g., 437 apertures, are formed) is formed, in addition to the at least one aperture 21, such that it extends from at least one first connecting aperture 27 (desirably a plurality of first connecting apertures) to an inner area 41 of the front surface (the front surface area 40) of the shower plate 12 for passing a dry gas therethrough in this direction. The at least one first connecting aperture 27 is connected to a first aperture 26 (at least one first aperture) such that a dry gas is introduced to the first aperture 26, the at least one first connecting aperture 27, and then to the at least one first aperture 22.

In FIG. 9, the first aperture 26 extends from the surface of the at least one stepped section 30 of the rear surface side of the shower plate 12. The first aperture 26 may extend from the surface of the sidewall of the shower plate 12. The inner area 41 may form a circle-like two-dimensional shape with a diameter of about 50-300 mm. However, the inner area 41 may have a different two-dimensional shape and/or size. The dry gas (inner) as shown in FIG. 2 is introduced to the chamber through the at least one first aperture 22.

Figure 10:
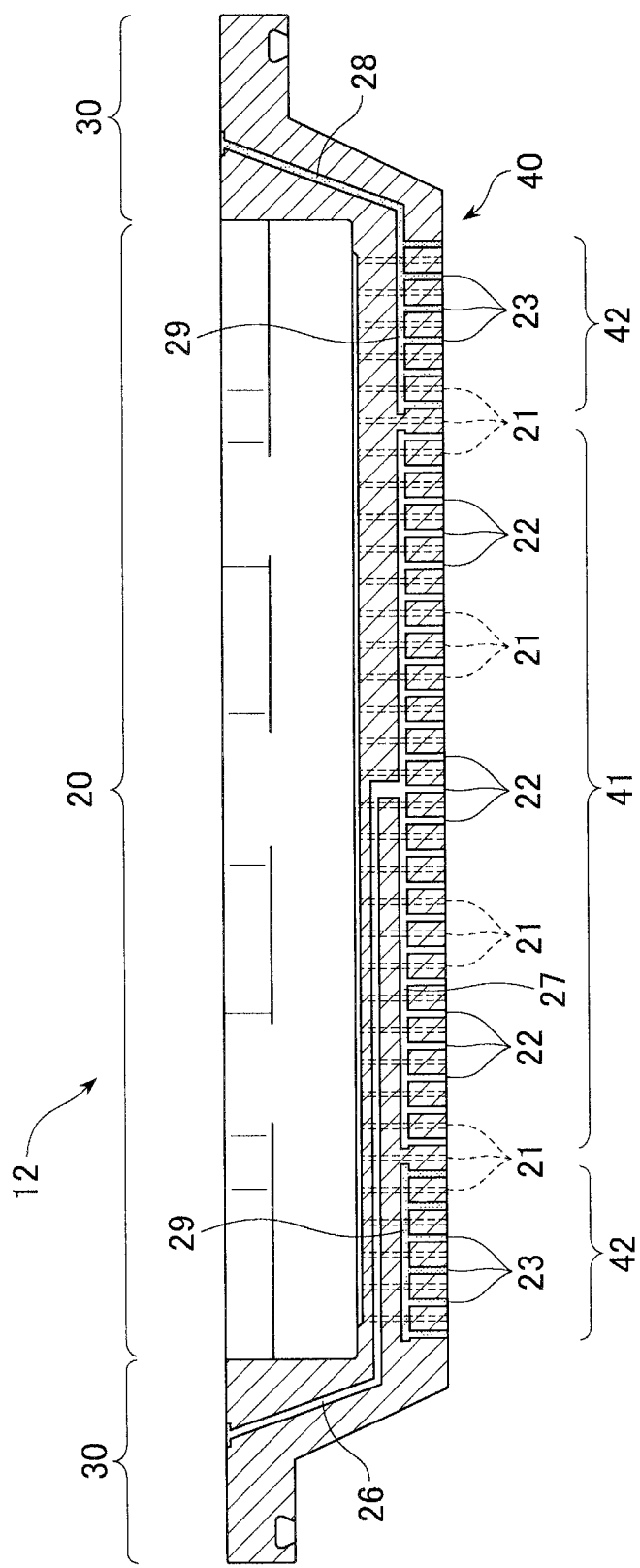
FIG. 10 is a cross-sectional view at the location shown in FIG. 11 of the shower plate according to an embodiment.

Next, as FIG. 10 shows, at least one second aperture 23 (desirably a plurality of second apertures or holes, e.g., 504 apertures, are formed) is formed, in addition to the at least one aperture 21, such that it extends from at least one second connecting aperture 29 to an outer area 42 of the front surface (the front surface area 40) of the shower plate 12 for passing a dry gas therethrough in this direction. The at least one second connecting aperture 29 is connected to a second aperture 28 (at least one second aperture) such that a dry gas is introduced to the second aperture 28, the at least one second connecting aperture 29, and then to the at least one second aperture 23.

In FIG. 10, the second aperture 28 extends from the surface of the at least one stepped section 30 of the rear surface side of the shower plate 12. The second aperture 28 may extend from the surface of the sidewall of the shower plate 12. The outer area 42 is the rest of the area of the front surface (the front surface area 40) other than the inner area 41. The dry gas (outer) as shown in FIG. 2 is introduced to the chamber through the at least one second aperture 23.

Figure 11:
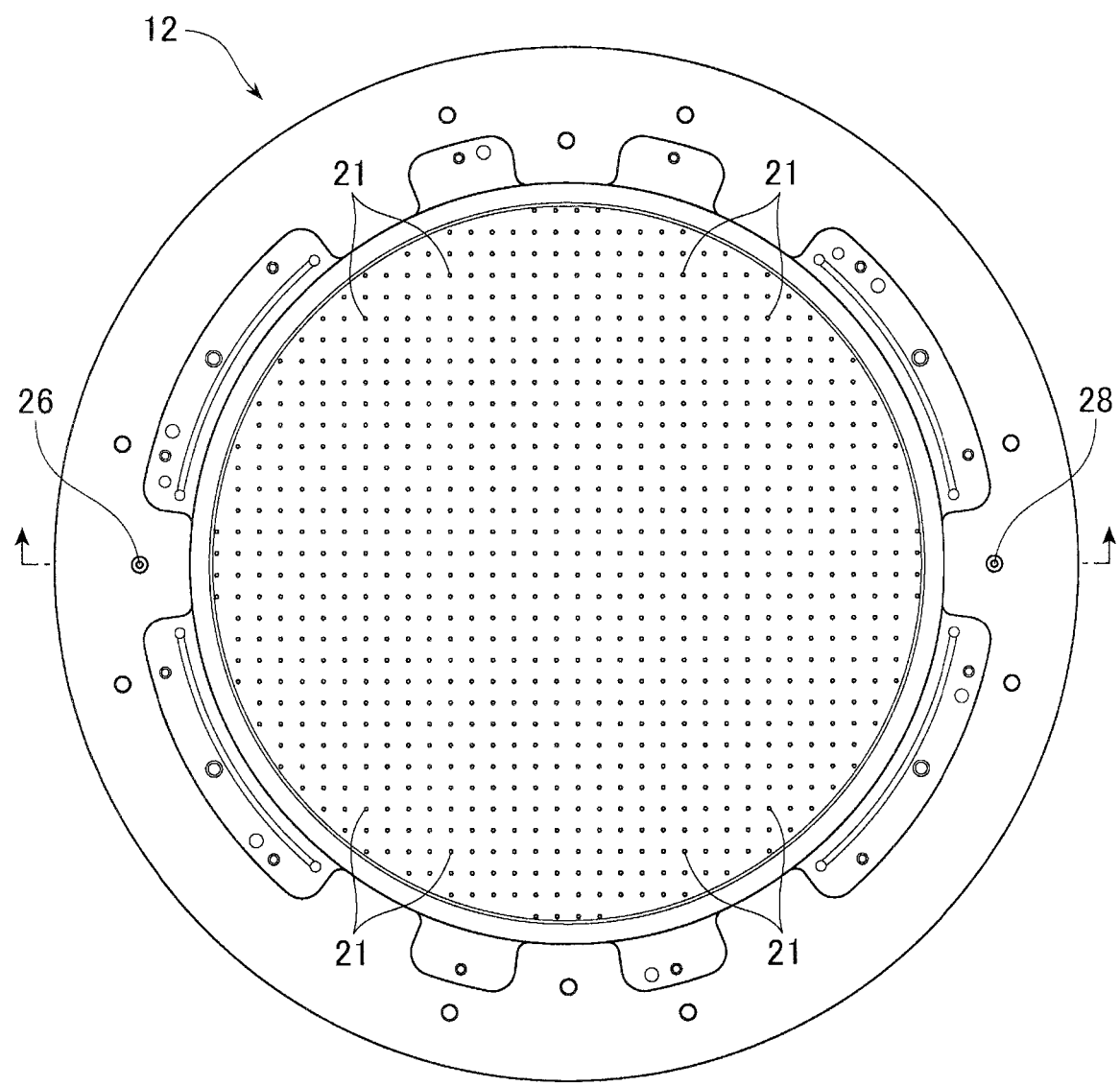
FIG. 11 is a top view of the shower plate according to an embodiment.

FIG. 11 shows a top view of the shower plate 12 (a rear surface side of the shower plate 12). As shown in FIG. 11, there are a plurality of apertures 21 (e.g., 928 apertures) for passing a carrier gas (and a precursor gas) to the chamber 10 on the other side of the shower plate 12. In FIG. 11, one end of the first aperture 26 and one end of the second aperture 28 are also shown at the surface of the at least one stepped section.

Figure 12:
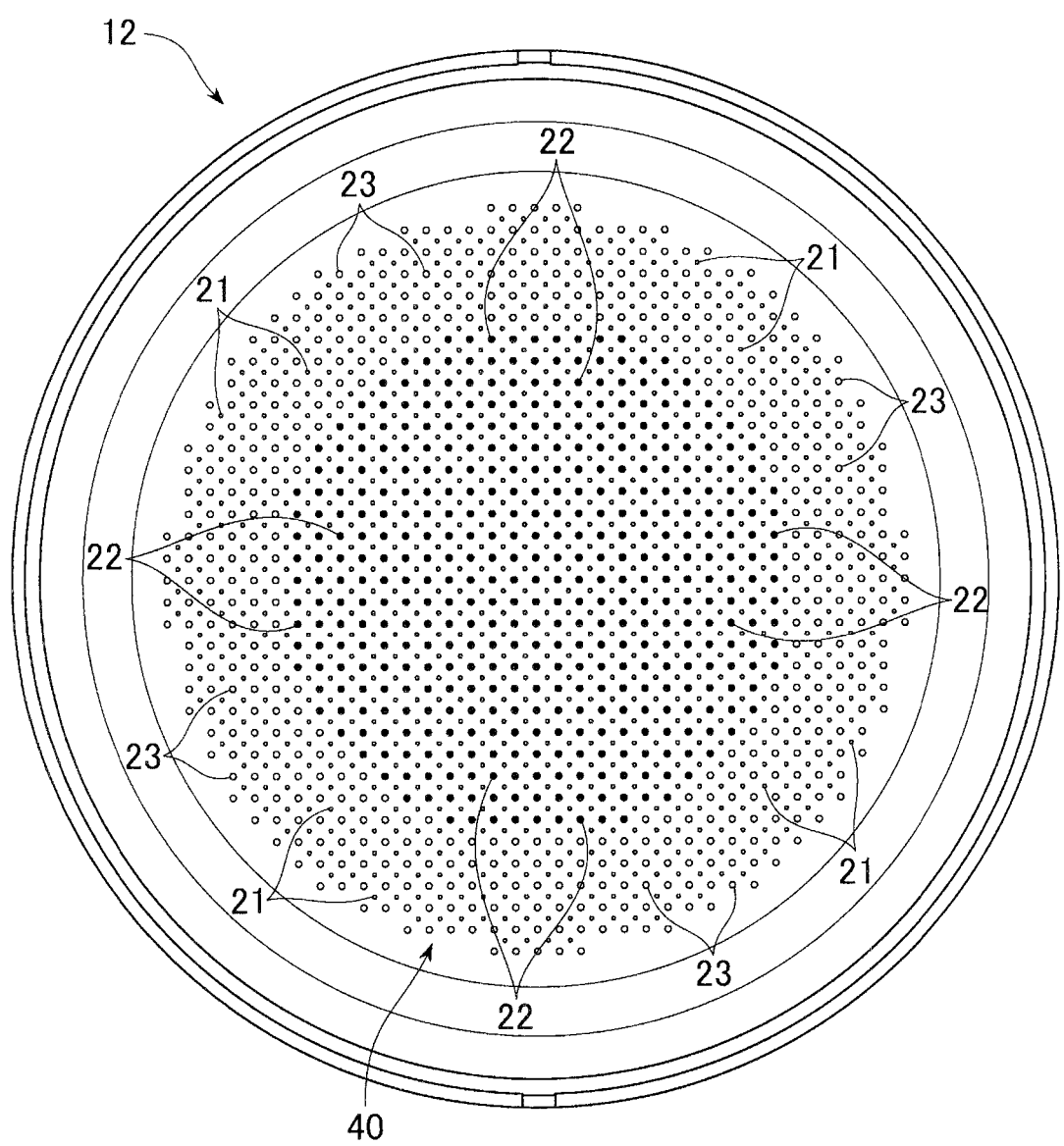
FIG. 12 is a bottom view of the shower plate according to an embodiment.

FIG. 12 shows a bottom view of the shower plate 12 (a front surface side (the front surface area 40) of the shower plate 12). As shown in FIG. 12, there are a plurality of apertures 21 (e.g., 928 apertures) for passing the carrier gas (and the precursor gas) to the chamber 10 on the other side of the shower plate 12. Also, there are a plurality of first apertures 22 (e.g., 437 apertures) for passing the dry gas (inner) to the chamber 10, and a plurality of second apertures 23 (e.g., 504 apertures) for passing the dry gas (outer) to the chamber 10. For illustrative purposes, these apertures 21, 22 and 23 are depicted differently in shape, size and so forth in FIG. 12, however, these apertures 21, 22 and 23 may have the same size and shape. Typically, the cross-sectional width (e.g., diameter) of each of the plurality of apertures 21, each of the plurality of first apertures 22, and each of the plurality of second apertures 22 is about 0.5 mm.

Figure 13:
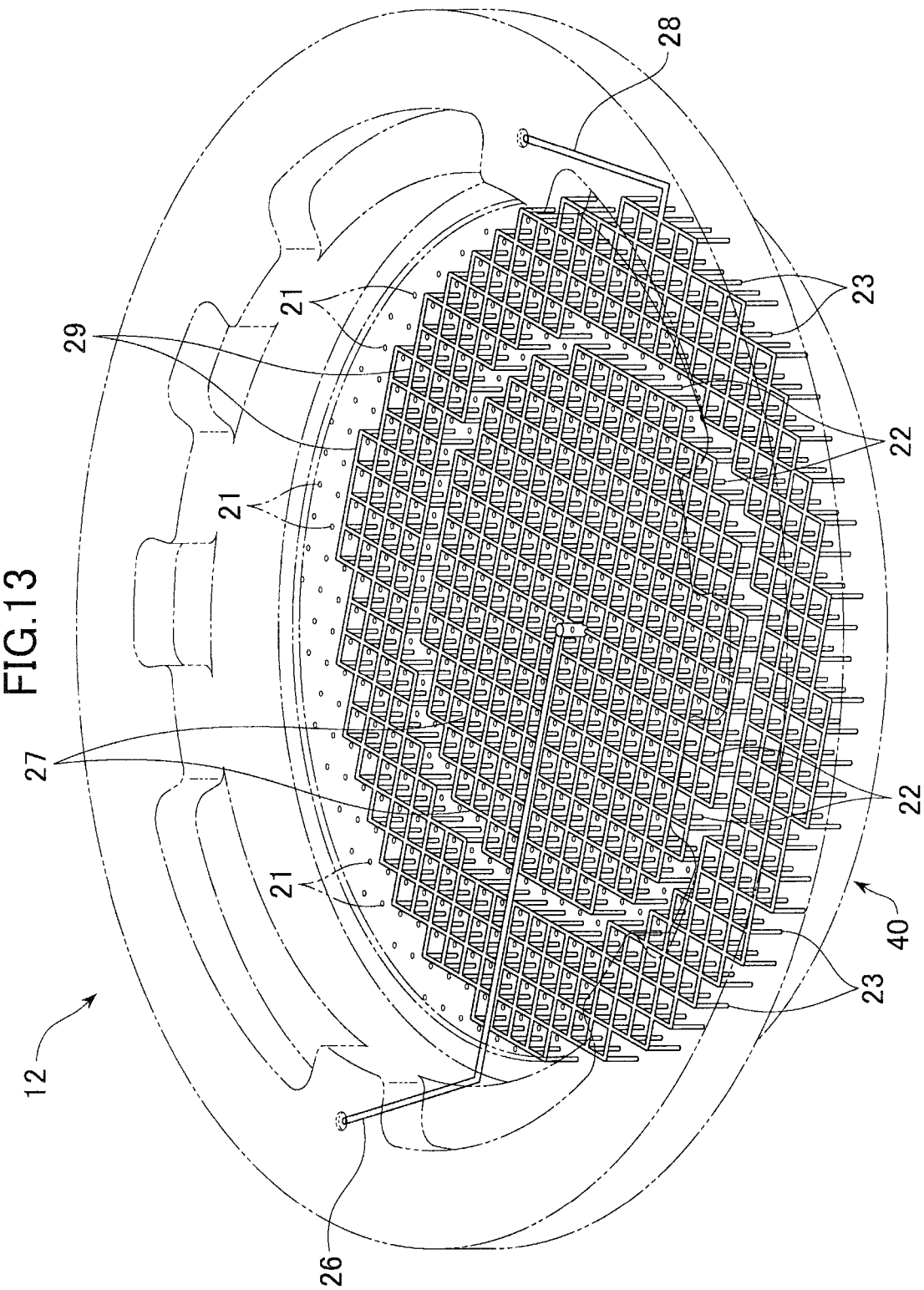
FIG. 13 is a perspective view of the plurality of first apertures and the plurality of second apertures of the shower plate according to an embodiment.

FIG. 13 shows a schematic illustration of a perspective view of the plurality of first apertures 22 and the plurality of second apertures 23 formed in the shower plate 12 (for illustrative purposes, the three-dimensional shape of the apertures 21 are omitted). As shown in FIG. 13, the plurality of first apertures 22 are formed in the inner area of the front surface area 40 and are connected via a plurality of first connecting apertures 27 (e.g., connecting lines or ducts) to at least one first aperture 26 (at least one main line or duct). The at least one first aperture 26 extends from the surface of the stepped section (at least one stepped section 30) to the inner side of the shower plate 12, and it further extends in parallel to the shower plate 12 to the center area of the shower plate 12, and then connects to the first connecting apertures 27. The first connecting apertures 27 are composed of a plurality of connecting apertures that connect the at least one first aperture 26 to each of the plurality of first apertures 22.

As shown in FIG. 13, the plurality of second apertures 23 are formed in the outer area of the front surface area 40 and are connected via a plurality of second connecting apertures 29 (e.g., connecting lines or ducts) to at least one second aperture 28 (at least one main line or duct). The at least one second aperture 28 extends from the surface of the stepped section (at least one stepped section 30) to the inner side of the shower plate 12, and it further extends in parallel to the shower plate 12 to connect to the second connecting apertures 29. The second connecting apertures 29 are composed of a plurality of connecting apertures that connect the at least one second aperture 28 to each of the plurality of second apertures 23.

In one embodiment, there is provided a shower plate adapted to be installed in a plasma deposition apparatus comprising a gas inlet port, a showerhead, a workpiece support and a reaction chamber, the shower plate being adapted to be attached to the showerhead and comprising: a rear surface adapted to face the gas inlet port; a front surface opposite to the rear surface; and a sidewall that defines the width of the shower plate, wherein the shower plate has a plurality of apertures each extending from the rear surface to the front surface for passing a carrier gas therethrough in this direction, and wherein the shower plate further has a plurality of first apertures each extending from a first connecting apertures to an inner part of the front surface therethrough in this direction for passing a dry gas to the chamber, and a plurality of second apertures each extending from a second connecting apertures to an outer part of the front surface therethrough in this direction for passing a dry gas to the chamber, and wherein the first connecting apertures connect the plurality of first apertures to at least one first aperture extending from the sidewall side of the shower plate and the second connecting apertures connect the plurality of second apertures to at least one second aperture extending from the sidewall side of the shower plate.

In one embodiment, the inner part or area of the front surface has an area of a circle-like shape with a diameter of about 50-300 mm, and the outer part or area of the front surface is the rest of the area of the front surface.

The sidewall side of the shower plate may include both the at least one stepped section (on the rear surface side) of the shower plate or the sidewall of the shower plate. In one embodiment, the shower plate further has at least one stepped section on the rear surface side of the shower plate, the rear surface being surrounded peripherally by the at least one stepped section and the at least one first aperture and the at least one second aperture extending from the sidewall side of the shower plate extend from a surface of the at least one stepped section of the shower plate.

In one embodiment, the at least one first aperture and the at least one second aperture extending from the sidewall side of the shower plate extend from a surface of the sidewall of the shower plate.

In one embodiment, the shower plate has the number of about 5-3000 of the first apertures each extending from the first connecting apertures to the inner part of the front surface, and the number of about 40-4000 of the second apertures each extending from the second connecting apertures to the outer part of the front surface.

In one embodiment, the shower plate further has a plurality of third apertures each extending from at least one third connecting aperture to the inner or outer part of the front surface for passing a dry gas therethrough in this direction to the chamber. Additionally, there may be provided a plurality of fourth apertures, fifth apertures or more extending from each connecting apertures to the inner part or outer part of the front surface for passing a dry gas therethrough in this direction to the chamber.

In one embodiment, the shower plate further has a plurality of third apertures each extending from at least one third connecting aperture to the inner part and outer part of the front surface for passing a dry gas therethrough in this direction to the chamber. Additionally, there may be provided a plurality of fourth apertures, fifth apertures or more extending from each connecting apertures to the inner part and outer part of the front surface for passing a dry gas therethrough in this direction to the chamber.

Figure 14:
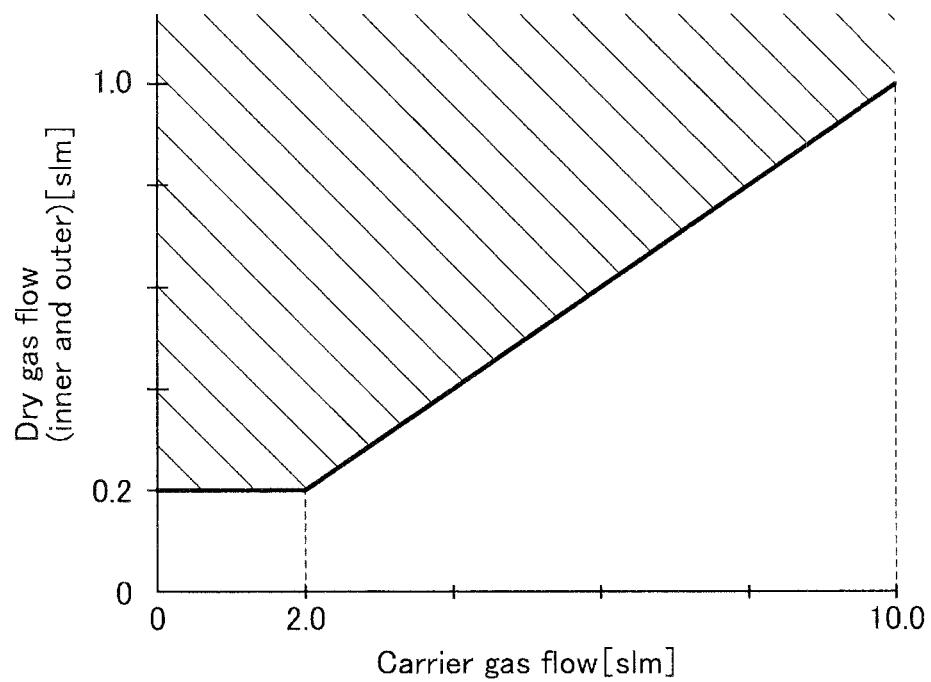
FIG. 14 is a graph showing a relationship between carrier gas flow and dry gas flow (inner and outer).

FIG. 14 shows a relationship between the carrier gas flow and the dry gas flow (inner and outer). FIG. 14 shows that the flow rate of the carrier gas may be between 0-10.0 slm, but, in typical cases, the flow rate of the carrier gas to the chamber from the plurality of apertures each extending from the rear surface to the front surface may be set to between 0.2-10.0 slm.

The flow rate of the dry gas to the chamber from the plurality of first apertures each extending from the first connecting apertures to the inner part of the front surface may be set to between 0.1-10.0 slm. Also, the flow rate of the dry gas to the chamber from the plurality of second apertures each extending from the second connecting apertures to the inner part of the front surface is set to between 0.1-10.0 slm. When the flow rate of the dry gas (inner) and the dry gas (outer) is set to 0.1 slm respectively, the flow rate of the dry gas (inner and outer) is calculated to be 0.2 slm. For purposes of controlling the residence time of the precursor gas or reactant gas, the minimum flow rate of the dry gas (inner) and dry gas (outer) is 0.1 slm respectively.

In one embodiment, when the flow rate of the carrier gas to the chamber from the plurality of apertures is set to around 2.0 slm or less, the flow rate of the dry gas to the chamber from the plurality of first apertures and the plurality of second apertures is set to around 0.2 slm or more, as FIG. 14 shows.

In one embodiment, when the flow rate of the carrier gas to the chamber from the plurality of apertures is set to more than 2.0 slm, the flow rate of the dry gas to the chamber from the plurality of first apertures and the plurality of second apertures is set to one-tenth or more of the flow rate of the carrier gas. For purposes of controlling the residence time of the precursor gas or reactant gas, if the flow rate of the dry gas (inner) and dry gas (outer) is set less than one-tenth the carrier gas flow, it was found that it may become difficult to control the residence time of the precursor gas or reactant gas at the center area on or around the substrate, as the impact of the carrier gas flow becomes more predominant.

In one embodiment, the ratio of the flow rate of the dry gas to the chamber from the plurality of first apertures to that of the dry gas to the chamber from the plurality of second apertures may be set to between 0.05-20 throughout the cycles. When the residence time of the precursor gas or the reactant gas needs to be increased, the dry gas (inner) flow rate may be set to less than the dry gas (outer) flow rate. On the other hand, When the residence time of the precursor gas or the reactant gas needs to be decreased, the dry gas (inner) flow rate may be set to more than the dry gas (outer) flow rate.

In one embodiment, the ratio of the flow rate of the dry gas to the chamber from the plurality of first apertures to that of the dry gas to the chamber from the plurality of second apertures may be controlled to between 0.05-20 during the cycle when a precursor gas is introduced. The ratio of the flow rate may be varied during the cycle when a precursor gas in introduced.

In one embodiment, the ratio of the flow rate of the dry gas to the chamber from the plurality of first apertures to that of the dry gas to the chamber from the plurality of second apertures may be controlled to between 0.05-20 during the cycle when a RF power is on. The ratio of the flow rate may be varied during the cycle when a RF power is on.

In one embodiment, the ratio of the flow rate of the dry gas to the chamber from the plurality of first apertures to that of the dry gas to the chamber from the plurality of second apertures may be controlled to between 0.05-20 during the cycle when a precursor gas is not introduced and a RF power is off. The ratio of the flow rate may be varied during such cycle. This cycle may include a purge cycle or other cycle.

Referring now back to FIG. 2, there may be a transitional cycle or phase between the cycle when the precursor gas is introduced and the purge cycle, between the purge and the cycle when the RF power is on, or between the cycle when the RF power is on and the purge cycle, as the target flow rate of gases may not be achieved instantly. In the transitional cycle or phase, the flow rate of the carrier gas may be changed from its initial rate to the target rate. In the transitional cycle or phase, the flow rate of the dry gas (inner) and/or dry gas (outer) may be changed from its initial rate to the target rate. In this way, the target flow rate of the carrier gas and/or the dry gas (inner) and/or the dry gas (outer) can be achieved from the beginning of the next cycle. This transitional cycle or phase may also be incorporated in the purge cycle or any other cycles including, but not limited to, the cycle when the precursor gas is introduced and the cycle when the RE power is on.

Embodiments of the present invention will be explained in detail with reference to specific examples that are not intended to limit the present invention. The numerical numbers applied in specific examples may be modified by a range of at least ±50%, wherein the endpoints of the ranges may be included or excluded.

EXAMPLES

An embodiment of the present invention will now be explained with reference to the following examples, which is not intended to limit the scope of the present invention.

Example 1

Shower plate with a plurality of first apertures and a plurality of second apertures for providing a dry gas to the chamber A schematic view of an embodiment of a shower plate structure with a gas channel (the showerhead) is shown in FIG. 3. The showerhead 11 has a shower plate structure 12 and a gas channel 13 which partially define a gas inlet space. The shower plate 12 has a stepped section 30 on the rear surface side of the shower plate 12, and a rear surface area 20 (a rear surface) is surrounded peripherally by the stepped section 30. Although not shown in FIG. 3, at least one first aperture 22 and at least one second aperture 23 are formed for providing a dry gas to the chamber (FIGS. 4-8 show one example of the shower plate structure 12).

Configuration of the aperture 21:
Number of apertures: 928
Aperture diameter: 0.5 mm
Length: 25 mm
Location of the aperture: From the entire area of the rear surface to the entire area of the front surface of the shower plate
Diameter of front surface: 310 mm
Configuration of the aperture 22:
Number of apertures: 437
Aperture diameter: 0.5 mm
Location of the aperture: From the first connecting apertures to the inner area of the front surface of the shower plate
Diameter of inner area: 220 mm
Configuration of the aperture 23:
Number of apertures: 504
Aperture diameter: 0.5 mm
Location of the aperture: From the second connecting apertures to the outer area of the front surface of the shower plate
Size of outer area: 100 mm A carrier gas (including a carrier gas mixture) in the gas inlet space is introduced via a number of apertures (holes) 21 of the shower plate structure into the chamber. A dry gas is introduced via a number of first apertures (holes) 22 of the shower plate into the inner area of the chamber. A dry gas is also introduced via a number of second apertures (holes) 23 of the shower plate into the outer area of the chamber. A carrier gas line and two dry gas lines are all separate lines. Apertures 21 extend from the rear surface 20 of the shower plate to the front surface 40 of the shower plate to provide a carrier gas and a precursor gas (including a precursor gas mixture).

The main aperture (the first aperture 26) extends from the surface of the stepped section 30 of the shower plate 12 to the first connecting apertures 27, and the plurality of first apertures 22 extend from the first connecting apertures 27 to the inner area 41 of the front surface 40 for providing a dry gas to the inner part of the chamber. The inner area 41 of the front surface 40 of the shower plate may have a diameter of about 50-300 mm. The main aperture (the second aperture 28) extends from the surface of the stepped section 30 of the shower plate 12 to the second connecting apertures 29, and the plurality of second apertures 23 extend from the second connecting apertures 29 to the outer area 42 of the front surface 40 for providing a dry gas to the outer part of the chamber. In this way, the dry gas flow (inner) and the dry gas flow (outer) can be controlled separately and independently, which enables the processing apparatus with the shower plate to control the residence time of a precursor gas or reactant gas within the inner part on or around the surface of a substrate in the chamber.

FIG. 21 shows a relationship between each flow rate of carrier gas and dry gas (inner) and dry gas (outer) and relative residence time of a precursor gas or reactant gas. As shown in FIG. 21, when the carrier gas flow is 2.00 [slm] and the dry gas flow (inner) and the dry gas flow (outer) is 1.00 [slm] respectively (Condition 1), the relative residence time is described as 1.00 for both the center point on the substrate and the edge area on the substrate of about 300 mm from the center point. But when the dry gas flow (inner) becomes 0.47 [slm] and the dry gas flow (outer) becomes 1.53 [slm], while the carrier gas flow remains 2.00 [slm], it was found out that the relative residence time to Condition 1 becomes 1.36 at the center point on the substrate and 1.00 at the edge area on the substrate of about 300 mm from the center point (Condition 2). On the other hand, as shown in FIG. 21, when the dry gas flow (inner) becomes 1.35 [slm] and the dry gas flow (outer) becomes 0.65 [slm], while the carrier gas flow remains 2.00 [slm], it was found out that the relative residence time to Condition 1 becomes 0.85 at the center point on the substrate and 1.00 at the edge area on the substrate of about 300 mm from the center point (Condition 3). Note that the pressure on or around the substrate within the chamber and other conditions are substantially the same, but, not to mention, it may vary depending on the area within the chamber, in which case, the flow rate of the above gases may be adjusted accordingly.

Figure 15:
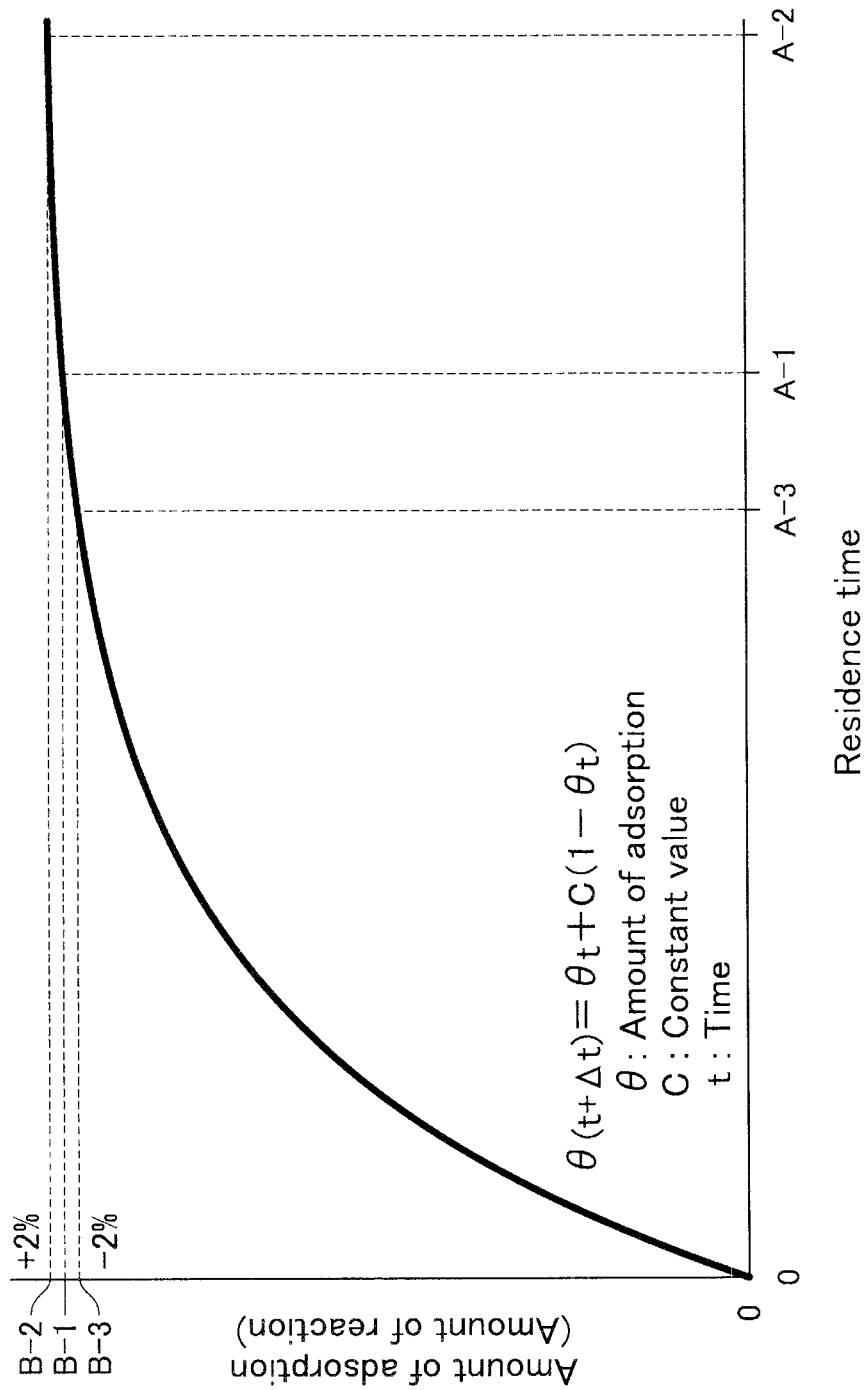
FIG. 15 is a graph showing a relationship between the residence time of a precursor gas or reactant gas and the amount of absorption (reaction) of such gas on the substrate.

FIG. 15 shows a relationship between the residence time of the precursor gas or reactant gas and the amount of absorption (reaction) of such gas on the substrate. When the residence time is A-1, the amount of reaction of such gas equals B-1. When the residence time of such gas becomes longer, the amount of reaction of such gas becomes larger. It was found out that when the residence time becomes 1.04 times longer than A-1 to become A-2, the amount of reaction becomes 2% larger than B-1 to become B-2. On the other hand, it was also found out that when the residence time becomes 0.97 times longer than A-1 to be A-3, the amount of reaction becomes 2% smaller than B-1 to become B-3. As can be seen in FIG. 15, the amount of reaction does not increase linearly against the residence time. The more the residence time becomes, the less the amount of increase in the reaction becomes. In this example, A-1, A-2 and A-3 are within the non-saturation stage and occur at the later stage of the reaction curve, and C-1, C-2 and C-3 in the next example are also within the non-saturation stage but occur at the earlier stage of the reaction curve.

Figure 16:
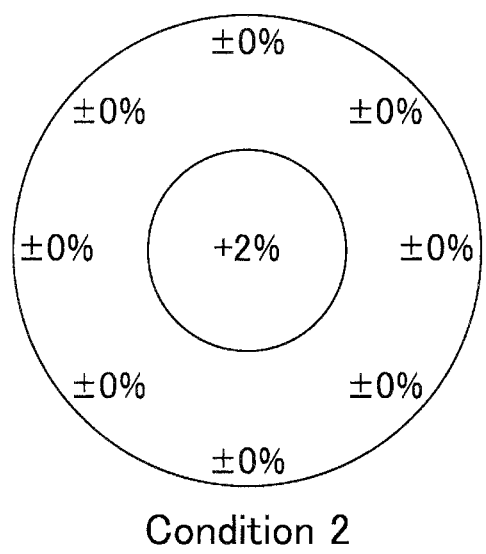
FIG. 16 is a map of an increase in the amount of reaction at each location on a substrate according to Example 1.

The experimental result of Condition 2 is shown in FIG. 16. FIG. 16 shows a map of reaction ratio of each location of a precursor gas or reactant gas introduced on or around the surface of a substrate. As can be seen in FIG. 16, the amount of reaction on the center point on the substrate becomes 2% larger, while the amount of reaction on the edge area on the substrate of about 300 mm from the center point becomes unchanged. As the result shows, it was found out that the amount of reaction at the center area of the substrate can be increased with the control of the relative residence time (or the residence time) which is possible by optimally controlling the ratio of the flow rate of the dry gas (inner) to the dry gas (outer) and the flow rate of the dry gas (inner) and the dry gas (outer) relative to that of the carrier gas.

Figure 17:
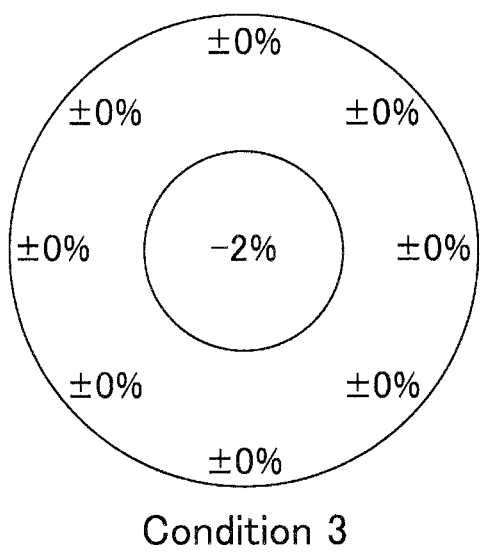
FIG. 17 is a map of a decrease in the amount of reaction at each location on a substrate according to Example 1.

The experimental result of Condition 3 is shown in FIG. 17. FIG. 17 shows a map of reaction ratio of each location of a precursor gas or reactant gas introduced on or around the surface of a substrate. As can be seen in FIG. 17, the amount of reaction on the center point on the substrate becomes 2% smaller, while the amount of reaction on the edge area on the substrate of about 300 mm from the center point becomes unchanged. As the result shows, it was found out that the amount of reaction at the center area of the substrate can be decreased with the control of the relative residence time (or the residence time) which is possible by optimally controlling the ratio of the flow rate of the dry gas (inner) to the dry gas (outer), and the flow rate of the dry gas (inner) and the dry gas (outer) relative to that of the carrier gas.

Example 2

Shower plate with a plurality of first apertures and a plurality of second apertures for providing a dry gas to the chamber A schematic view of an embodiment of a shower plate structure with a gas channel (the showerhead) is shown in FIG. 3. The showerhead 11 has a shower plate structure 12 and a gas channel 13 which partially define a gas inlet space. The shower plate 12 has a stepped section 30 on the rear surface side of the shower plate 12, and a rear surface area 20 (a rear surface) is surrounded peripherally by the stepped section 30. Although not shown in FIG. 3, at least one first aperture 22 and at least one second aperture 23 are formed for providing a dry gas to the chamber (FIGS. 4-8 show one example of the shower plate structure 12).

Configuration of the aperture 21:
Number of apertures: 928
Aperture diameter: 0.5 mm
Length: 25 mm
Location of the aperture: From the entire area of the rear surface to the entire area of the front surface of the shower plate
Diameter of front surface: 310 mm
Configuration of the aperture 22:
Number of apertures: 437
Aperture diameter: 0.5 mm
Location of the aperture: From the first connecting apertures to the inner area of the front surface of the shower plate
Diameter of inner area: 220 mm
Configuration of the aperture 23:
Number of apertures: 504
Aperture diameter: 0.5 mm
Location of the aperture: From the second connecting apertures to the outer area of the front surface of the shower plate
Size of inner area: 100 mm A carrier gas in the gas inlet space is introduced via a number of apertures (holes) 21 of the shower plate structure into the chamber. A dry gas is introduced via a number of first apertures (holes) 22 of the shower plate into the inner area of the chamber. A dry gas is also introduced via a number of second apertures (holes) 23 of the shower plate into the outer area of the chamber. A carrier gas line and two dry gas lines are all separate lines. Apertures 21 extend from the rear surface 20 of the shower plate to the front surface 40 of the shower plate to provide a carrier gas and a precursor gas.

The main aperture (the first aperture 26) extends from the surface of the stepped section 30 of the shower plate 12 to the first connecting apertures 27, and the plurality of first apertures 22 extend from the first connecting apertures 27 to the inner area 41 of the front surface 40 for providing a dry gas to the inner part of the chamber. The inner area 41 of the front surface 40 of the shower plate may have a diameter of about 50-300 mm. The main aperture (the second aperture 28) extends from the surface of the stepped section 30 of the shower plate 12 to the second connecting apertures 29, and the plurality of second apertures 23 extend from the second connecting apertures 29 to the outer area 42 of the front surface 40 for providing a dry gas to the outer part of the chamber. In this way, the dry gas flow (inner) and the dry gas flow (outer) can be controlled separately and independently, which enables the processing apparatus with the shower plate to control the residence time of a precursor gas or reactant gas within the inner part on or around the surface of a substrate in the chamber.

FIG. 22 shows a relationship between each flow rate of carrier gas and dry gas (inner) and dry gas (outer) and relative residence time of a precursor gas or reactant gas. As shown in FIG. 22, when the carrier gas flow is 2.00 [slm] and the dry gas flow (inner) and the dry gas flow (outer) is 1.00 [slm] respectively (Condition 1), the relative residence time is described as 1.00 for both the center point on the substrate and the edge area on the substrate of about 300 mm from the center point. But when the dry gas flow (inner) becomes 0.92 [slm] and the dry gas flow (outer) becomes 1.08 [slm], while the carrier gas flow remains 2.00 [slm], it was found out that the relative residence time to Condition 1 becomes 1.04 at the center point on the substrate and 1.00 at the edge area on the substrate of about 300 mm from the center point (Condition 2). On the other hand, as shown in FIG. 22, when the dry gas flow (inner) becomes 1.07 [slm] and the dry gas flow (outer) becomes 0.93 [slm], while the carrier gas flow remains 2.00 [slm], it was found out that the relative residence time to Condition 1 becomes 0.97 at the center point on the substrate and 1.00 at the edge area on the substrate of about 300 mm from the center point (Condition 3). Note that the pressure on or around the substrate within the chamber and other conditions are substantially the same, but, not to mention, it may vary depending on the area within the chamber, in which case, the flow rate of the above gases may be adjusted accordingly.

Figure 18:
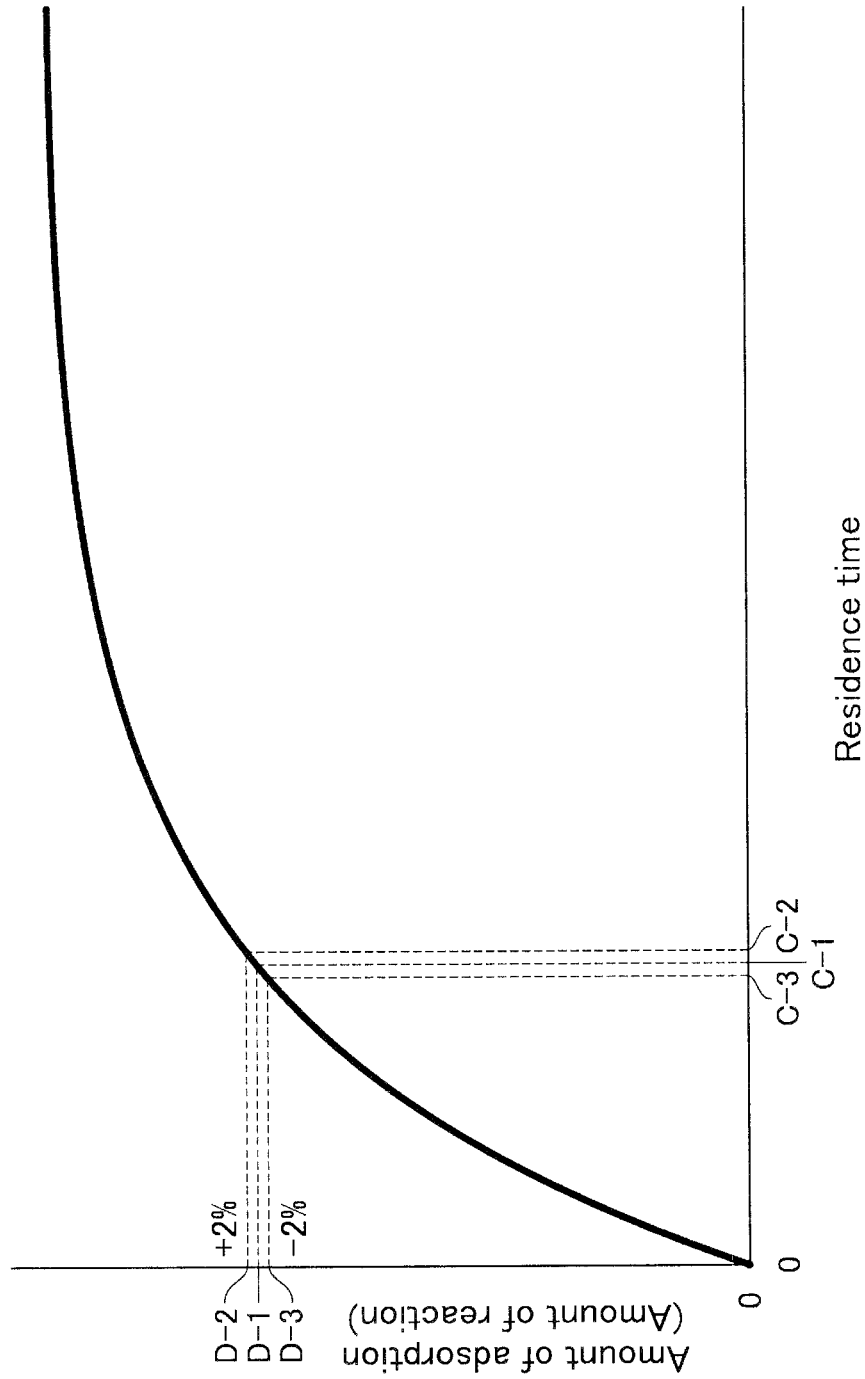
FIG. 18 is a graph showing a relationship between the residence time of a precursor gas or reactant gas and the amount of absorption (reaction) of such gas on the substrate.

FIG. 18 shows a relationship between the residence time of the precursor gas or reactant gas and the amount of absorption (reaction) of such gas on the substrate. When the residence time is C-1, the amount of reaction of such gas equals D-1. When the residence time of such gas becomes longer, the amount of reaction of such gas becomes larger. It was found out that when the residence time becomes 1.04 times longer than C-1 to become C-2, the amount of reaction becomes 2% larger than D-1 to become D-2. On the other hand, it was also found out that when the residence time becomes 0.97 times longer than C-1 to be C-3, the amount of reaction becomes 2% smaller than D-1 to become D-3. In this example, the residence time is within the earlier stage of the reaction curve (or the growing stage of the reaction curve). As can be seen, the amount of reaction does not increase linearly against the residence time. The more the residence time becomes, the less the amount of increase in the reaction becomes.

Figure 19:
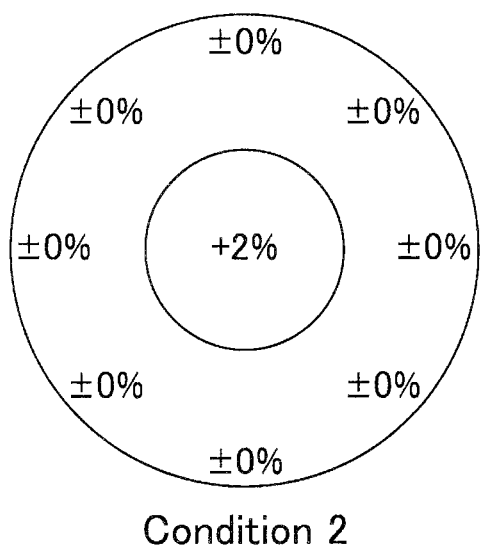
FIG. 19 is a map of an increase in the amount of reaction at each location on a substrate according to Example 2.

The experimental result of Condition 2 is shown in FIG. 19. FIG. 19 shows a map of reaction ratio of each location of a precursor gas or reactant gas introduced on or around the surface of a substrate. As can be seen in FIG. 19, the amount of reaction on the center point on the substrate becomes 2% larger, while the amount of reaction on the edge area on the substrate of about 300 mm from the center point becomes unchanged. As the result shows, it was found out that the amount of reaction at the center area of the substrate can be increased with the control of the relative residence time (or the residence time) which is possible by optimally controlling the ratio of the flow rate of the dry gas (inner) to the dry gas (outer) and the flow rate of the dry gas (inner) and the dry gas (outer) relative to that of the carrier gas.

Figure 20:
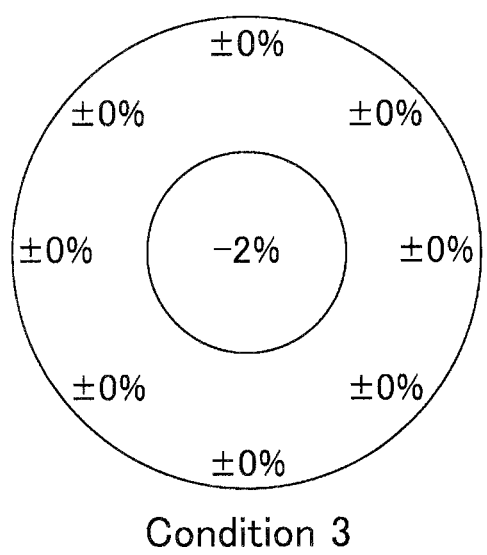
FIG. 20 is a map of a decrease in the amount of reaction at each location on a substrate according to Example 2.

The experimental result of Condition 3 is shown in FIG. 20. FIG. 20 shows a map of reaction ratio of each location of a precursor gas or reactant gas introduced on or around the surface of a substrate. As can be seen in FIG. 20, the amount of reaction on the center point on the substrate becomes 2% smaller, while the amount of reaction on the edge area on the substrate of about 300 mm from the center point becomes unchanged. As the result shows, it was found out that the amount of reaction at the center area of the substrate can be decreased with the control of the relative residence time (or the residence time) which is possible by optimally controlling the ratio of the flow rate of the dry gas (inner) to the dry gas (outer), and the flow rate of the dry gas (inner) and the dry gas (outer) relative to that of the carrier gas.

With respect to the use of substantially any plural and/or singular terms herein, those having skill in the art can translate from the plural to the singular and/or from the singular to the plural as is appropriate to the context. References to a gas herein include a gas mixture within the scope of that term. As feasible, any feature or aspect of any embodiment or example may be substituted for (e.g., from another embodiment or example), added (e.g., from another embodiment or example), or removed.

Any discussion of the background art which has been included in the present disclosure is solely for the purpose of providing a context for the present invention, and it should not be taken as an admission that any or all of the discussion form part of the prior art or were known in the art at the time the invention was made.

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A shower plate adapted to be installed in a processing apparatus comprising a gas inlet port, a showerhead, a workpiece support and a reaction chamber, the shower plate being adapted to be attached to the showerhead and comprising:
    a front surface adapted to face the workpiece support;
    a rear surface opposite to the front surface; and
    a sidewall that defines the width of the shower plate,
    wherein the shower plate has a plurality of through apertures each extending from the rear surface to the front surface for passing a carrier gas therethrough in this direction,
    wherein the shower plate further has a plurality of first apertures each extending from at least one first connecting aperture to an inner part of the front surface for passing a dry gas of a different chemical composition than the carrier gas therethrough in this direction to the chamber, and a plurality of second apertures each extending from at least one second connecting aperture to an outer part of the front surface for passing a dry gas of a different chemical composition than the carrier gas therethrough in this direction to the chamber,
    wherein through apertures are interspersed among the first apertures and among the second apertures, and
    wherein the at least one first connecting aperture connects the plurality of first apertures to at least one first passage, the at least one first passage extending from the sidewall side of the shower plate and the at least one first passage terminating at a location inward of the plurality of second apertures, and the at least one second connecting aperture connects the plurality of second apertures to at least one second passage, the at least one second passage extending from the sidewall side of the shower plate and the at least one second passage terminating at a location inward of the plurality of second apertures and of at least one of the first apertures.

2. The shower plate according to claim 1, wherein the inner part of the front surface has an area with a diameter of about 50-300 mm, and the outer part of the front surface is the rest of the area of the front surface surrounding the inner part until a diameter of about 50-350 mm.

3. The shower plate according to claim 1, wherein the shower plate further has at least one stepped section on the rear surface side of the shower plate, the rear surface surrounded peripherally by the at least one stepped section and the at least one first passage and the at least one second passage extending from the sidewall side of the shower plate extend from a surface of the at least one stepped section of the shower plate.

4. The shower plate according to claim 1, wherein the at least one first passage and the at least one second passage extending from the sidewall side of the shower plate extend from a surface of the sidewall of the shower plate.

5. The shower plate according to claim 1, wherein the shower plate has a number of about 437 of the plurality of first apertures each extending from the at least one first connecting aperture to the inner part of the front surface, and a number of about 504 of the plurality of second apertures each extending from the at least one second connecting aperture to the outer part of the front surface.

6. The shower plate according to claim 1, wherein the shower plate further has a plurality of third apertures each extending from at least one third connecting aperture to the inner or outer part of the front surface for passing a dry gas therethrough in this direction to the chamber.

7. The shower plate according to claim 1, wherein the shower plate further has a plurality of third apertures each extending from at least one third connecting aperture to the inner part and outer part of the front surface for passing a dry gas therethrough in this direction to the chamber.

8. A substrate processing apparatus comprising the shower plate according to claim 1.

9. A processing apparatus comprising:
    a gas inlet port;
    a showerhead;
    a workpiece support;
    a reaction chamber; and
    a shower plate attached to the showerhead, the shower plate comprising:
        a front surface adapted to face the workpiece support;
        a rear surface opposite to the front surface; and
        a sidewall that defines the width of the shower plate,
        wherein the shower plate has a plurality of through apertures each extending from the rear surface to the front surface for passing a carrier gas therethrough in this direction,
        wherein the shower plate further has a plurality of first apertures each extending from at least one first connecting aperture to an inner part of the front surface for passing a dry gas therethrough in this direction to the chamber, and a plurality of second apertures each extending from at least one second connecting aperture to an outer part of the front surface for passing a dry gas therethrough in this direction to the chamber, and wherein the at least one first connecting aperture connects the plurality of first apertures to at least one first passage, the at least one first passage extending from the sidewall side of the shower plate and the at least one first passage terminating at a location inward of the plurality of second apertures, and the at least one second connecting aperture connects the plurality of second apertures to at least one second passage, the at least one second passage extending from the sidewall side of the shower plate and the at least one second passage terminating at a location inward of the plurality of second apertures and of at least one of the first apertures.

10. The processing apparatus according to claim 9, wherein the shower plate further has a plurality of third apertures each extending from at least one third connecting aperture to the inner or outer part of the front surface for passing a dry gas therethrough in this direction to the chamber.

11. The processing apparatus according to claim 9, wherein the shower plate further has a plurality of third apertures each extending from at least one third connecting aperture to the inner part and outer part of the front surface for passing a dry gas therethrough in this direction to the chamber.

12. The processing apparatus according to claim 9, wherein the inner part of the front surface has an area with a diameter of about 50-300 mm, and the outer part of the front surface is the rest of the area of the front surface surrounding the inner part until a diameter of about 50-350 mm.

13. The processing apparatus according to claim 9, wherein the shower plate further has at least one stepped section on the rear surface side of the shower plate, the rear surface surrounded peripherally by the at least one stepped section and the at least one first passage and the at least one second passage extending from the sidewall side of the shower plate extend from a surface of the at least one stepped section of the shower plate.

14. The processing apparatus according to claim 9, wherein the at least one first passage and the at least one second passage extending from the sidewall side of the shower plate extend from a surface of the sidewall of the shower plate.

15. The processing apparatus according to claim 9, wherein the shower plate has a number of about 437 of the plurality of first apertures each extending from the at least one first connecting aperture to the inner part of the front surface, and a number of about 504 of the plurality of second apertures each extending from the at least one second connecting aperture to the outer part of the front surface.

16. A processing method, comprising:
supplying gas using a gas inlet port and a shower plate attached to a showerhead to a reaction chamber and a workpiece support, the shower plate comprising:
a front surface adapted to face the workpiece support;
a rear surface opposite to the front surface; and
a sidewall that defines the width of the shower plate,
wherein the shower plate has a plurality of through apertures each extending from the rear surface to the front surface and passing a carrier gas therethrough in this direction,
wherein the shower plate further has a plurality of first apertures each extending from at least one first connecting aperture to an inner part of the front surface and passing a dry gas therethrough in this direction to the chamber, and a plurality of second apertures each extending from at least one second connecting aperture to an outer part of the front surface and passing a dry gas therethrough in this direction to the chamber, and
wherein the at least one first connecting aperture connects the plurality of first apertures to at least one first passage, the at least one first passage extending from the sidewall side of the shower plate and the at least one first passage terminating at a location inward of the plurality of second apertures, and the at least one second connecting aperture connects the plurality of second apertures to at least one second passage, the at least one second passage extending from the sidewall side of the shower plate and the at least one second passage terminating at a location inward of the plurality of second apertures and of at least one of the first apertures.

17. The method of claim 16, wherein the shower plate further has a plurality of third apertures each extending from at least one third connecting aperture to the inner or outer part of the front surface and passing a dry gas therethrough in this direction to the chamber.

18. The method of claim 16, further comprising controlling the supply of dry gas such that the ratio of the flow rate of the dry gas to the chamber from the plurality of first apertures to that of the dry gas to the chamber from the plurality of second apertures is set to between 0.05-20.

19. The method of claim 16, further comprising controlling supply of carrier gas and supply of dry gas, so that, when the flow rate of carrier gas to the chamber from the plurality of through apertures is set to around 2.0 slm or less, the flow rate of the dry gas to the chamber from the plurality of first apertures and the plurality of second apertures is around 0.2 slm or more.

* * * * *